United States Patent
Ishimaru et al.

(10) Patent No.: US 8,361,876 B2
(45) Date of Patent: Jan. 29, 2013

(54) MANUFACTURING METHOD OF SEMICONDUCTOR DEVICE

(75) Inventors: Toshiyuki Ishimaru, Kanagawa (JP); Kenji Takeo, Kanagawa (JP); Ryo Takahashi, Kumamoto (JP)

(73) Assignee: Sony Corporation, Tokyo (JP)

( * ) Notice: Subject to any disclaimer, the term of this patent is extended or adjusted under 35 U.S.C. 154(b) by 23 days.

(21) Appl. No.: 12/703,252

(22) Filed: Feb. 10, 2010

(65) Prior Publication Data
US 2010/0210088 A1 Aug. 19, 2010

(30) Foreign Application Priority Data
Feb. 19, 2009 (JP) .................................. 2009-037233

(51) Int. Cl.
*H01L 21/76* (2006.01)
*G01B 11/00* (2006.01)

(52) U.S. Cl. ........ 438/401; 438/439; 356/401; 257/797; 257/E21.597

(58) Field of Classification Search .................. 438/401, 438/439; 356/401; 257/797, E21.597
See application file for complete search history.

(56) References Cited

U.S. PATENT DOCUMENTS

| | | | | |
|---|---|---|---|---|
| 5,047,833 A * | 9/1991 | Gould | ............................ | 257/772 |
| 5,369,050 A * | 11/1994 | Kawai | ............................ | 438/401 |
| 5,733,690 A * | 3/1998 | Jeong et al. | ........................ | 430/5 |
| 5,966,614 A * | 10/1999 | Park et al. | ............................ | 438/401 |
| 6,028,332 A * | 2/2000 | Kano et al. | ...................... | 257/254 |
| 6,372,600 B1 * | 4/2002 | Desko et al. | .................... | 438/406 |
| 6,821,867 B2 * | 11/2004 | Matsuura et al. | ............. | 438/462 |
| 6,861,186 B1 * | 3/2005 | Pagette et al. | .................... | 430/22 |
| 6,987,053 B2 * | 1/2006 | Wu et al. | ........................ | 438/401 |
| 7,541,256 B2 * | 6/2009 | Swain et al. | ................... | 438/401 |
| 7,898,095 B2 * | 3/2011 | Patti et al. | ....................... | 257/797 |
| 8,039,366 B2 * | 10/2011 | Holloway et al. | ............. | 438/462 |
| 2002/0163072 A1 * | 11/2002 | Gupta et al. | .................... | 257/698 |
| 2005/0085059 A1 * | 4/2005 | Kim et al. | ...................... | 438/592 |
| 2006/0138681 A1 * | 6/2006 | Best et al. | ...................... | 257/797 |
| 2007/0216041 A1 * | 9/2007 | Patti et al. | ...................... | 257/797 |
| 2011/0127645 A1 * | 6/2011 | Kang et al. | ..................... | 257/620 |

FOREIGN PATENT DOCUMENTS

| | | |
|---|---|---|
| JP | 04-259249 | 9/1992 |
| JP | 04-364070 | 12/1992 |
| JP | 2005-268738 | 9/2005 |
| JP | 2006-019757 | 1/2006 |

OTHER PUBLICATIONS

Japanese Office Action issued on Jan. 18, 2011 in connection with counterpart JP application No. 2009-037233.

* cited by examiner

*Primary Examiner* — Charles Garber
*Assistant Examiner* — Ron Pompey
(74) *Attorney, Agent, or Firm* — SNR Denton US LLP

(57) ABSTRACT

A manufacturing method of a semiconductor device includes the steps of: forming first and second alignment marks by forming first and second alignment mark grooves on a first surface of a semiconductor substrate and filling the grooves with a material different from the semiconductor substrate; forming a first element on the first surface in alignment using the first alignment mark; bonding a support substrate to the first surface; reversing a bonded structure of the support substrate and the semiconductor substrate around a predetermined axis and thinning the semiconductor substrate from a second surface side of the semiconductor substrate at least until a thickness with which a position of the second alignment mark is detected by reflected light obtained by application of alignment light from the second surface side of the semiconductor substrate is obtained; and forming a second element on the second surface in alignment using the second alignment mark.

5 Claims, 28 Drawing Sheets

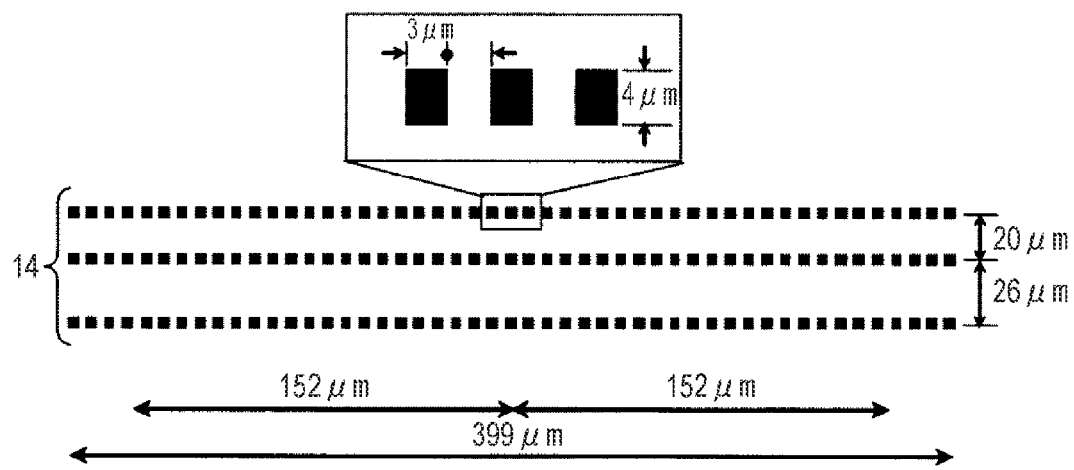
FIG. 7A
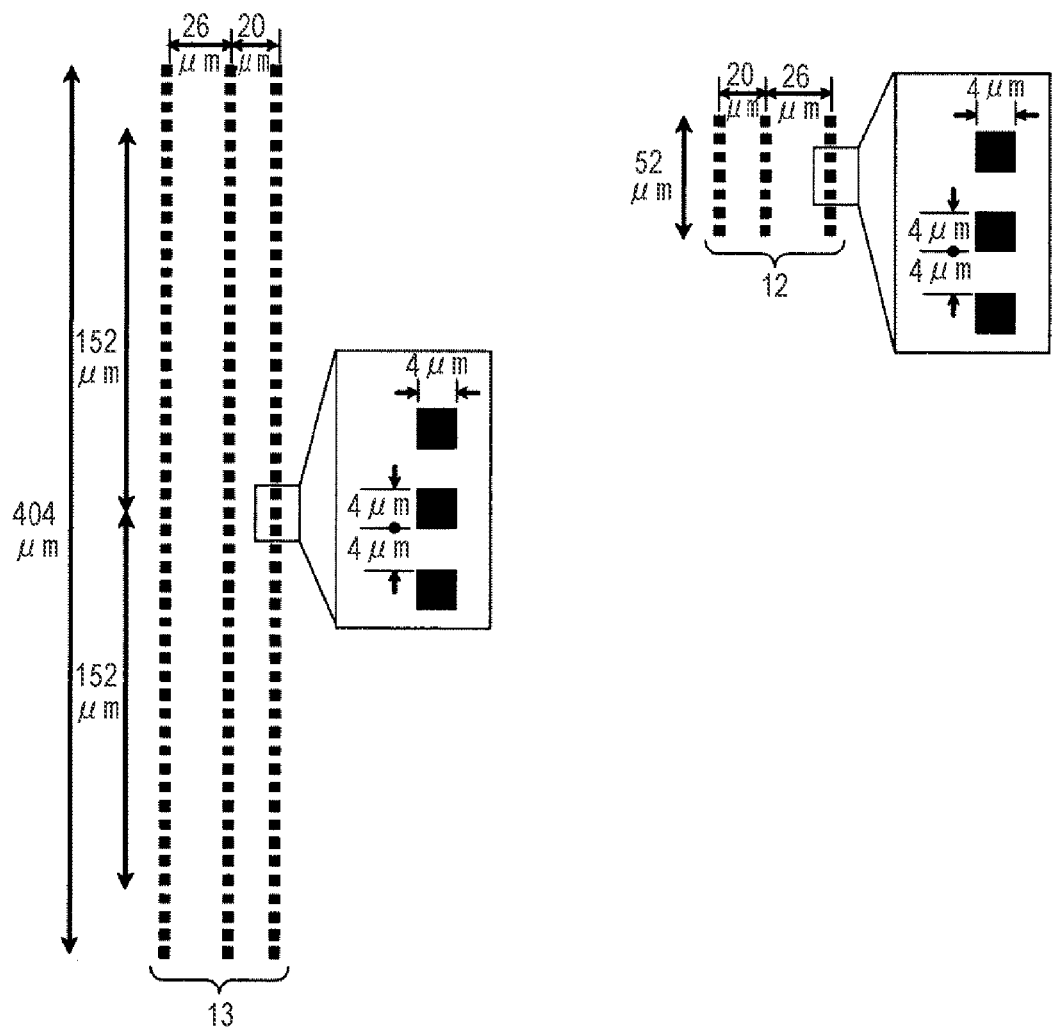
FIG. 7B
FIG. 7C

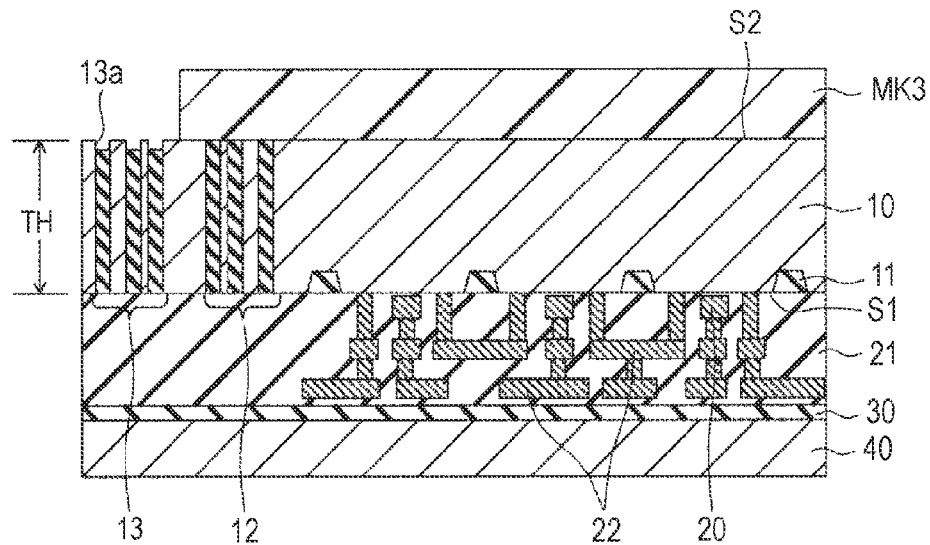
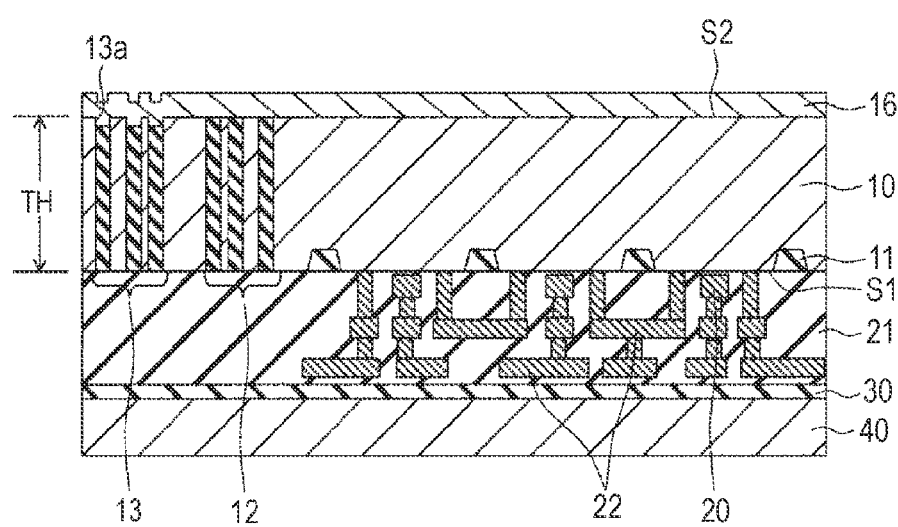
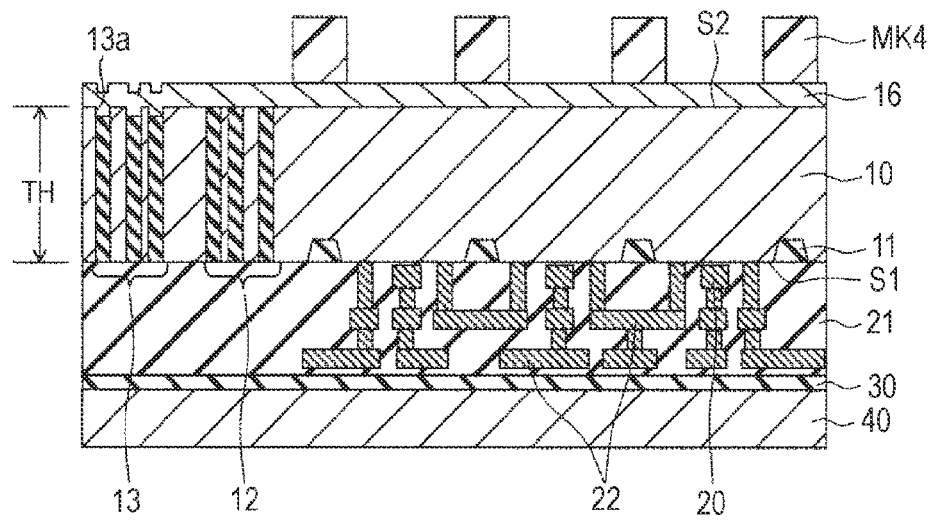

P1L

Ъ1Г

(rotated/mirrored "P1L")

MANUFACTURING METHOD OF SEMICONDUCTOR DEVICE

BACKGROUND OF THE INVENTION

1. Field of the Invention

The present invention relates to a manufacturing method of a semiconductor device, and specifically to a manufacturing method of a semiconductor device as a solid-state image sensing device formed by arranging pixels having photodiodes in a matrix on a light receiving surface thereof.

2. Background Art

A semiconductor device is generally formed on a semiconductor substrate. In the past, its performance has been remarkably improved with the progress of the microfabrication technology of lithography. However, the process cost of the lithography fabrication technology is increased as the fabrication becomes finer.

For example, as the exposure wavelength of exposure equipment becomes shorter to a g-ray (436 nm), an i-ray (365 nm), a Kr—F laser (248 nm), and an Ar—F laser (193 nm), the device price is increased and the photoresist material price becomes higher.

Further, technological problems are increased in improvements of performance of the semiconductor device by microfabrication and improvements of characteristics may be physically difficult.

For example, in the solid-state image sensing device, a photoelectric conversion element should be reduced as microfabrication makes progress. In this case, reduction of the saturated amount of charge and measures for random noise are necessary.

In the circumstances, a manufacturing method of a semiconductor device using a bonding technology of a semiconductor substrate attracts attention.

As an example of the manufacturing method, there is a method of fabricating a semiconductor device by bonding a substrate having a semiconductor function and a support substrate, and then, further performing a working process thereon.

For example, JP-A-4-364070 discloses a manufacturing method of an SRAM (Static Random Access Memory).

A manufacturing method of a semiconductor device using a bonding technology of substrates according to the above described related art will be described with reference to FIGS. 29A to 29D and FIGS. 30A to 30D.

Here, a semiconductor substrate 110 having semiconductor elements thereon and a support substrate 140 are bonded.

First, as shown in FIG. 29A, formation of plural transistors and formation of upper layer wires are performed on the first surface S1 of the semiconductor substrate 110 using a typical semiconductor manufacturing process.

FIG. 29B is an enlarged view of a part X of FIG. 29A. For example, element isolation insulator films 111 are formed in the semiconductor substrate 110, and the transistors are formed by forming gate electrodes 120 via gate insulator films (not shown), and an insulator film 121 is formed in the upper layer thereof. Here, upper layer wires 122 containing contacts are embedded in the insulator film.

Then, as shown in FIG. 29C, an adhesive layer 130 is applied onto the first surface S1 of the semiconductor substrate 110.

Then, as shown in FIG. 29D, the support substrate 140 is bonded to the first surface S1 of the semiconductor substrate 110 by the adhesive layer 130.

In this regard, for example, the substrates are bonded using notches (or orientation flats) as a characteristic shape of the semiconductor substrate.

Then, heating treatment is performed for the purpose of an improvement of adhesion between the semiconductor substrate 110 and the support substrate 140.

FIG. 30A shows FIG. 29D vertically reversed.

Then, as shown in FIG. 30B, the semiconductor substrate 110 is ground from the rear surface and the semiconductor substrate 110 is finally made thinner to have a predetermined film thickness by wet-etching processing.

Then, as shown in FIG. 30C, functional layers 115 are formed on the second surface S2 of the semiconductor substrate 110 obtained in the above described manner.

FIG. 30D is an enlarged view of a part Y of FIG. 30C. Films as the functional layers 115 are formed on the second surface S2 of the semiconductor substrate 110 bonded to the support substrate 140 in the above described manner. Then, a resist mask of a processing pattern is formed by applying a photoresist film, and performing overlay exposure on the circuit pattern of the semiconductor substrate 110, PEB (Post Exposure Bake), and developing treatment. Using this as a mask, processing treatment such as etching is performed, and thereby, the functional layers 115 having a desired function are formed.

Here, not only the method using the adhesive layer as a material for bonding, but also a method of forming oxide film materials on both the semiconductor substrate and the support substrate and bonding the semiconductor substrate and the support substrate by heating them is known. Further, the method of bonding the semiconductor substrate and the support substrate may be any method.

The overlay exposure on the circuit pattern of the above described semiconductor substrate is realized using an alignment optical system of the exposure equipment of detecting positions of rough alignment marks and fine alignment marks formed on the semiconductor substrate.

A typical process of performing overlay exposure of the exposure equipment is performed in the following manner, for example.

First, the mask is placed on a reticle stage, the equipment condition and the reference position of the mask are set, and the semiconductor substrate is placed on a wafer stage.

Then, for example, as alignment measurement of the exposure equipment, first, the rough alignment marks formed on the scribe lines of respective shots are measured and the shot arrangement of the entire semiconductor substrate is calculated.

The fine alignment marks formed on the scribe lines of respective shots are measured, and offsets X, Y of the entire wafer, the wafer scaling X, Y, wafer rotation, and orthogonality are calculated. Thereby, the detailed shot arrangement is determined. Furthermore, three or more alignment marks formed at exposure of respective shots on the scribe lines are measured, and thereby, also the shot scaling factor, the shot orthogonality, and the shot rotation can be calculated.

Then, settings necessary for exposure are made, and mask patterns are sequentially transferred onto the semiconductor substrate.

Then, the presence or absence of the semiconductor substrate to be exposed to light is determined and, if it is present, the wafer is unloaded and a new substrate is placed on the wafer stage, and the same process as that described above is repeated.

The manufacturing method of a semiconductor substrate using bonded substrates is described in JP-A-4-364070. JP-A-4-364070 discloses a method of forming an SRAM as a high-resistive device using bonded substrates. The variations in the resistance value of the high-resistive SRAM are suppressed and the interference noise is prevented. Further, independent of the memory cell area, the resistive device having a desired resistive length can be formed. Thereby, higher integration and higher capacity can be realized.

Further, a manufacturing method of a semiconductor device using bonded substrates is disclosed in JP-A-4-259249. In JP-A-4-259249, an N-channel MOS transistor (hereinafter, also referred to as NMOS) is formed as a TFT (thin-film transistor), and then, bonding is performed and a P-channel MOS transistor (hereinafter, also referred to as PMOS) is formed as a TFT on the opposed surface. The device has an SOI (Silicon on Insulator) structure in which the TFTs are formed on both sides of an insulator layer.

In the manufacturing method, a first alignment mark and a second alignment mark are provided, and the first alignment mark is used when the NMOSTFT is formed and the second alignment mark is used when the PMOSTFT is formed on the opposed surface.

Here, the semiconductor material as an active region is 800 nm or less and silicon oxide is used as the insulator layer of the SOI substrate, and thus, alignment light can be transmitted through the SOI substrate. Thereby, pattern formation can be performed using the second alignment mark provided on the NMOS formation surface when the PMOS is formed.

The bonding of the semiconductor substrate and the support substrate is performed according to a mechanical method using substrate outer shapes. FIGS. 31A and 31B are a plan view and a perspective view showing the process. An adhesive layer is attached to a surface of one of a semiconductor substrate W1 on which semiconductor chips CP pattern is provided and a support substrate W2, and then, the outer shapes including notches (N1, N2) are aligned and the substrates are bonded. Then, heat treatment for improving the adhesion between the substrates is performed.

However, recently, for higher added value of the semiconductor device, processing of a silicon layer thicker than 800 nm has been necessary.

For example, transistors are formed on one surface of a semiconductor layer thicker than 800 nm and elements having other functions are formed and functional layers are processed on the other surface.

In the above description, when a pattern is exposed on the second surface according to the circuit pattern of the first surface, the alignment marks provided on the first surface are detected from the second surface side. Here, visible light is used as an alignment light source of exposure equipment, and thus, if the silicon layer of the semiconductor material becomes thicker than 800 nm, the intensity of detection light of the alignment marks from the second surface side is drastically attenuated or may be impossible to be detected.

FIGS. 32A and 32B show schematic views of an example of alignment marks used in exposure equipment. These marks are rough alignment marks having asymmetric configurations, Y-marks YM and X-marks XM.

The marks include marks of three lines of sequentially arranged square patterns, and distances of the groups of patterns are 26 μm and 20 μm, respectively.

The positions of the marks are detected by the reflected light obtained when alignment light is applied. For example, an He—Ne laser is relatively scanned in scanning directions (SC1, SC2) in semi-transmissive orange directions. Alternatively, mark detection is performed by image recognition by the visible light. In this regard, signals along the three rows and noise due to scattered light from edges of scribe lines and chip patterns are detected. From the detection signals, the marks detected at the distances of 26 μm and 20 μm from the upstream of the scanning in detection of the Y-marks YM and detected at the distances of 20 μm and 26 μm from the upstream of the scanning in detection of the X-marks XM are recognized as rough alignment marks.

Then, using the rough alignment marks, the rough alignment marks after bonding have shapes shown in FIGS. 32C and 32D. In this case, the Y-marks YM can be recognized to be horizontally reversed, and the X-marks XM have mark distances of 26 μm, 20 μm, respectively.

In this regard, by the scanning using the He—Ne laser, the X-marks XM are not recognizable. This is because the detection distances of the X-marks XM are set to 20 μm, 26 μm as alignment parameters within exposure equipment, and signals adapted thereto are not detected.

On the other hand, if the detection distances of the marks are input as 20 μm, 26 μm, respectively, the X-marks become recognizable, however, there are problems that setting these values at each time in the mass production line for a wide variety of products in small quantities is not practical with reduced efficiency.

SUMMARY OF THE INVENTION

There is need for solving the problem that, when a pattern is exposed on the second surface according to the circuit pattern of the first surface, if a semiconductor substrate of silicon becomes thicker than 800 nm, the intensity of detection light of alignment marks from the second surface side is drastically attenuated or may be impossible to be detected.

A manufacturing method of a semiconductor device according to an embodiment of the invention includes the steps of: forming a first alignment mark and a second alignment mark by forming a first alignment mark groove and a second alignment mark groove on a first surface of a semiconductor substrate and filling the grooves with a material different from the semiconductor substrate; forming a first element on the first surface of the semiconductor substrate in alignment using the first alignment mark; bonding a support substrate to the first surface of the semiconductor substrate; reversing a bonded structure of the support substrate and the semiconductor substrate around a predetermined axis and thinning the semiconductor substrate from a second surface side of the semiconductor substrate at least until a thickness with which a position of the second alignment mark is detected by reflected light obtained by application of alignment light from the second surface side of the semiconductor substrate is obtained; and forming a second element on the second surface of the semiconductor substrate in alignment using the second alignment mark.

In the manufacturing method of the embodiment of the invention, first, the first alignment mark the second alignment mark are formed by forming the first alignment mark groove and the second alignment mark groove on the first surface of the semiconductor substrate and filling the grooves with the material different from the semiconductor substrate.

Then, the first element is formed on the first surface of the semiconductor substrate in alignment using the first alignment mark. Here, the first element includes a transistor or another functional layer.

Then, the support substrate is bonded to the first surface of the semiconductor substrate.

Then, the bonded structure of the support substrate and the semiconductor substrate is reversed around the predetermined axis and the semiconductor substrate is thinned from the second surface side of the semiconductor substrate at least until the thickness with which the position of the second alignment mark is detected by reflected light obtained by application of alignment light from the second surface side of the semiconductor substrate is obtained.

Then, the second element is formed on the second surface of the semiconductor substrate in alignment using the second alignment mark. Here, the second element includes a transistor or another functional layer such as a light shielding film a color filter.

In the manufacturing methods of the embodiment of the invention, in the case where the pattern is exposed to light on the second surface according to the circuit pattern of the first surface, the detection light of the alignment marks can be detected from the second surface side with high accuracy even when the semiconductor substrate of silicon is thicker than 800 nm.

BRIEF DESCRIPTION OF THE DRAWINGS

FIGS. 7A to 7C are plan views respectively showing specific examples of Y-marks and X-marks according to the first embodiment of the invention.

FIGS. 16A to 16C are sectional views showing a process of the manufacturing method of the semiconductor device according to the third embodiment of the invention.

FIGS. 24A to 24D are plan views of alignment marks for overlay accuracy measurement according to the sixth embodiment of the invention.

DESCRIPTION OF PREFERRED INVENTION

Hereinafter, semiconductor devices according to embodiments of the invention will be described with reference to the drawings.

The explanation will be made in the following order.

1. First Embodiment (method of forming alignment marks for first and second surfaces through semiconductor substrate)

2. First Example

3. Second Embodiment (method of optically identifying alignment marks for second surface from second surface side of semiconductor substrate)

4. Third Embodiment (method of forming alignment marks for first and second surfaces through semiconductor substrate and forming concave-convex shapes by removing part of second alignment marks exposed at second surface side)

5. Fourth Embodiment (method of optically identifying alignment marks for second surface from second surface side of semiconductor substrate and providing third alignment marks on second surface)

6. Second Example

7. Fifth Embodiment (method of forming symmetric first pattern, symmetric second pattern different from first pattern, and symmetric third pattern the same as first pattern as first and second alignment marks with second pattern between first pattern and third pattern)

8. Sixth Embodiment (method of forming main-measures pattern and sub-measures pattern for overlay accuracy measurement)

9. Seventh Embodiment (method of second alignment mark including pattern text)

1. First Embodiment

Overall Explanation of Semiconductor Device and Manufacturing Method Thereof

Figure 1A:
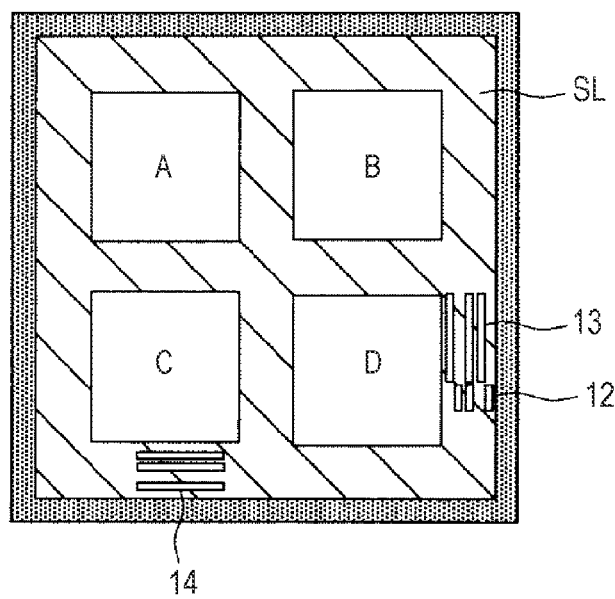
FIG. 1A is a plan view of an exposure mask used in a first embodiment of the invention.

FIG. 1A shows an exposure mask used in a manufacturing method of a semiconductor device for a part in which, for example, four semiconductor chips (A to D) are provided, and corresponds to a plan view showing an arrangement of alignment marks for the semiconductor chips.

For the four semiconductor chips (A to D), first alignment marks 12 and second alignment marks 13 are formed on scribe lines SL. The first alignment marks 12 and the second alignment marks 13 are rough alignment marks (X-marks) when an alignment search in the X-direction is performed. The first alignment marks 12 are used for the alignment search from the first surface side and the second alignment marks 13 are used for the alignment search from the second surface side.

On the scribe lines SL, Y-marks 14 as rough alignment marks when the search in the Y-direction is performed are further formed.

In the above configuration, one set of the first alignment marks 12, the second alignment marks 13, and the Y-marks 14 are formed for the four semiconductor chips (A to D), however, the above described one set of alignment marks may be formed with respect to each plural chips or one chip.

Figure 1B:
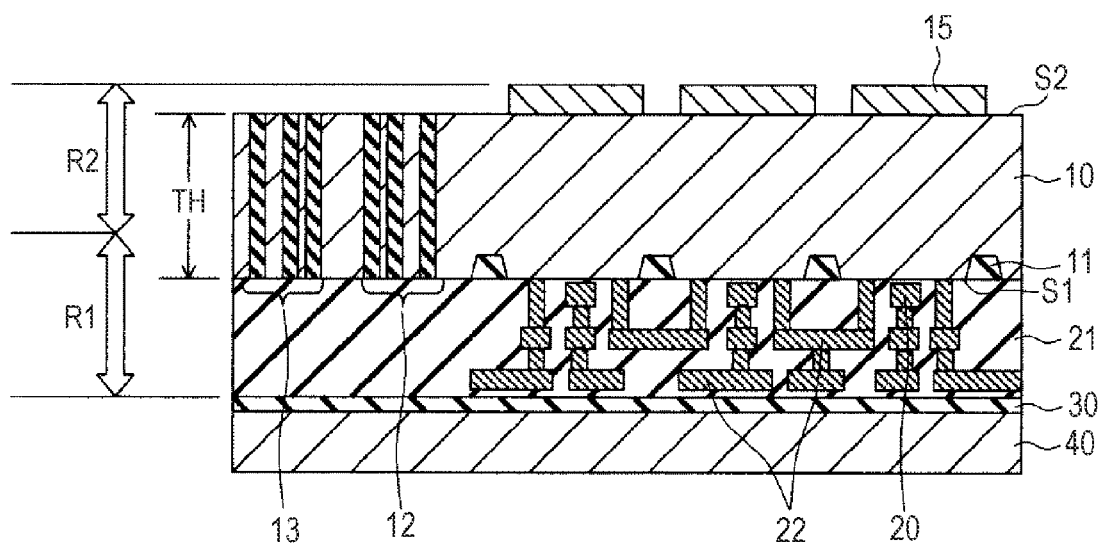
FIG. 1B is a sectional view of apart corresponding to semiconductor chips and scribe lines of FIG. 1A, for example.

FIG. 1B is a sectional view of a part corresponding to the semiconductor chips and the scribe lines of FIG. 1A, for example.

For example, element isolation insulator films 11 are formed on the first surface S1 of a semiconductor substrate 10, gate electrodes 20 are formed via gate insulator films (not shown), and thereby, transistors as first elements are formed. An insulator film 21 is formed in the upper layer of the transistors, and upper layer wires 22 containing contacts are embedded in the insulator film 21. The first elements may not be the transistors, but may be other functional layers.

Onto the insulator film 21, a support substrate 40 is bonded via an adhesive layer 30.

The semiconductor substrate 10 includes thin films from the second surface S2 side, and functional layers 15 as second elements are formed on the second surface S2. The functional layers 15 are color filters or light shielding films, for example. Further, as the second elements on the second surface S2, not only the functional layers but also functional elements such as transistors may be formed.

Furthermore, the first alignment marks 12 and the second alignment marks 13 are formed on the scribe lines.

In the embodiment, the thickness TH of the semiconductor substrate 10 is equal to or more than 800 nm, and the parts of the first alignment marks 12 and the second alignment marks 13 closest to the second surface S2 are exposed at the second surface side. That is, the first alignment marks 12 and the second alignment marks 13 are formed to penetrate the semiconductor substrate 10.

As shown in FIG. 1B, the part from the first surface S1 of the semiconductor substrate 10 and the insulator film 21 is the first region R1 in which the first elements are formed, and the part from the second surface S2 side of the semiconductor substrate 10 to the depth to some degree is the second region R2 in which the second elements are formed.

The above described semiconductor wafer is used after being diced along the scribe lines SL and separated.

A manufacturing method of the semiconductor device according to the embodiment will be explained with reference to FIGS. 2A to 2D and FIGS. 3A to 3D.

Here, bonding of the semiconductor substrate 10 provided with semiconductor elements and the support substrate 40 is performed.

Figure 2A:
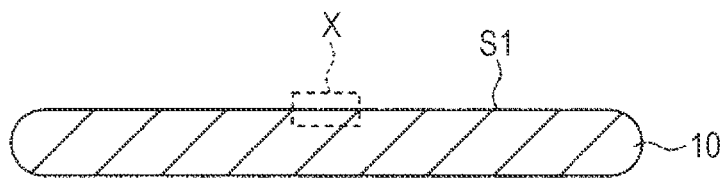
FIGS. 2A to 2D are schematic diagrams showing a manufacturing method of a semiconductor device using a bonding technology of substrates according to the first embodiment of the invention.

First, as shown in FIG. 2A, using a typical semiconductor manufacturing process, plural transistor and upper layer wires are formed on the first surface S1 of the semiconductor substrate 10.

Figure 2B:
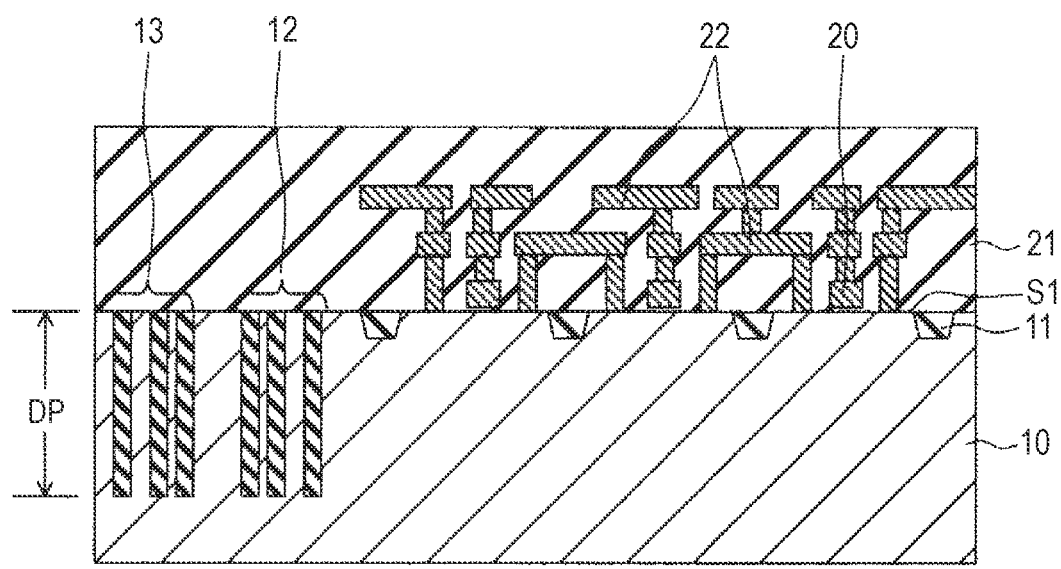

FIG. 2B is an enlarged view of a part X of FIG. 2A. For example, the STI (Shallow Trench Isolation) type element isolation elements 11 are formed on the semiconductor substrate 10.

Concurrently, in the scribe line region, grooves for the first alignment marks and grooves for the second alignment marks are formed in the substrate and the grooves are filled with a material different from that of the semiconductor substrate such as silicon oxide, and thereby, the first alignment marks 12 and the second alignment marks 13 are formed. The formation may be performed in the same manner as that of the element isolation insulator films. The material different from that of the semiconductor substrate may be a material optically different from that of the semiconductor substrate in order to be detected by alignment light, for example, silicon oxide, silicon nitride, polysilicon, or a multilayer structure of them.

The depths DP of the grooves of the first alignment marks 12 and the second alignment marks 13 are equal to or more than 800 nm, for example. Then, the gate electrodes 20 are formed via the gate insulator films (not shown), and thereby, transistors are formed. The insulator film 21 is formed in the upper layer. Here, the upper layer wires 22 containing contacts are embedded in the insulator film 21.

Figure 2C:
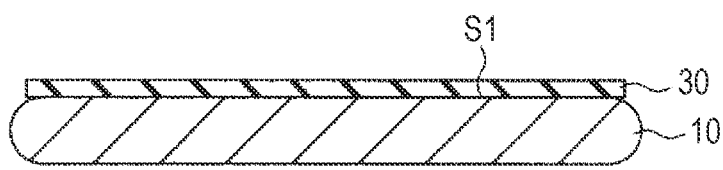

Then, as shown in FIG. 2C, the adhesive layer 30 is applied to the first surface S1 of the semiconductor substrate 10.

Figure 2D:
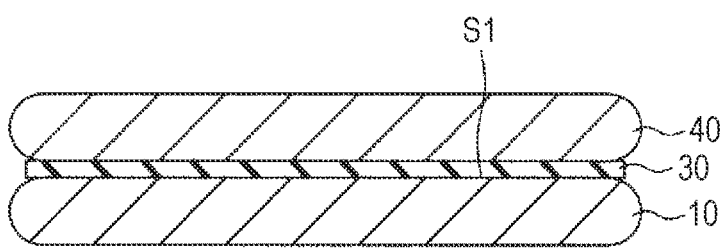

Then, as shown in FIG. 2D, the support substrate 40 is bonded to the first surface S1 of the semiconductor substrate 10 using the adhesive layer 30. For example, the substrates are bonded using notches (or orientation flats) as a characteristic shape of the semiconductor substrate.

Then, heat treatment for improving the adhesion between the semiconductor substrate 10 and the support substrate 40 is performed.

Figure 3A:
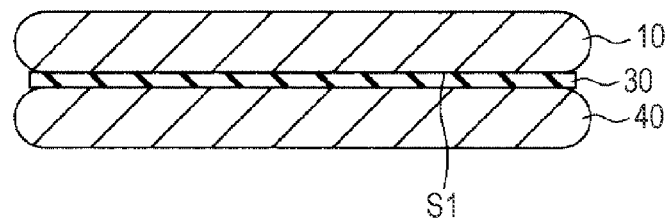
FIGS. 3A to 3D are schematic diagrams showing the manufacturing method of a semiconductor device using the bonding technology of substrates according to the first embodiment of the invention.

FIG. 3A shows FIG. 2D vertically reversed.

Figure 3B:
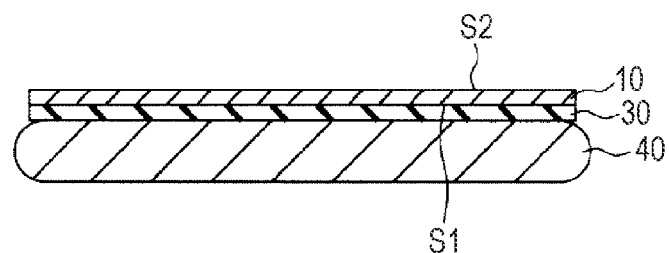

Then, as shown in FIG. 3B, the semiconductor substrate 10 is ground from the rear surface and the semiconductor substrate 10 is finally made thinner to have a predetermined film thickness by wet-etching processing.

Figure 3C:
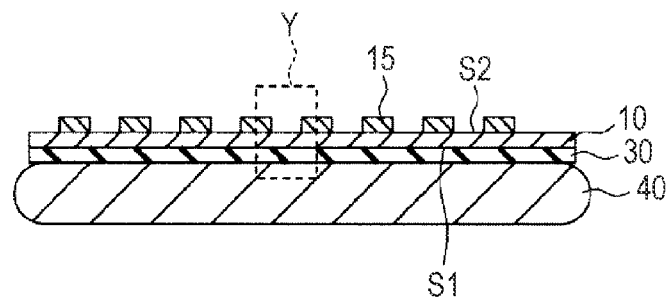

Then, as shown in FIG. 3C, the functional layers 15 are formed on the second surface S2 of the semiconductor substrate 10 obtained in the above described manner.

Figure 3D:
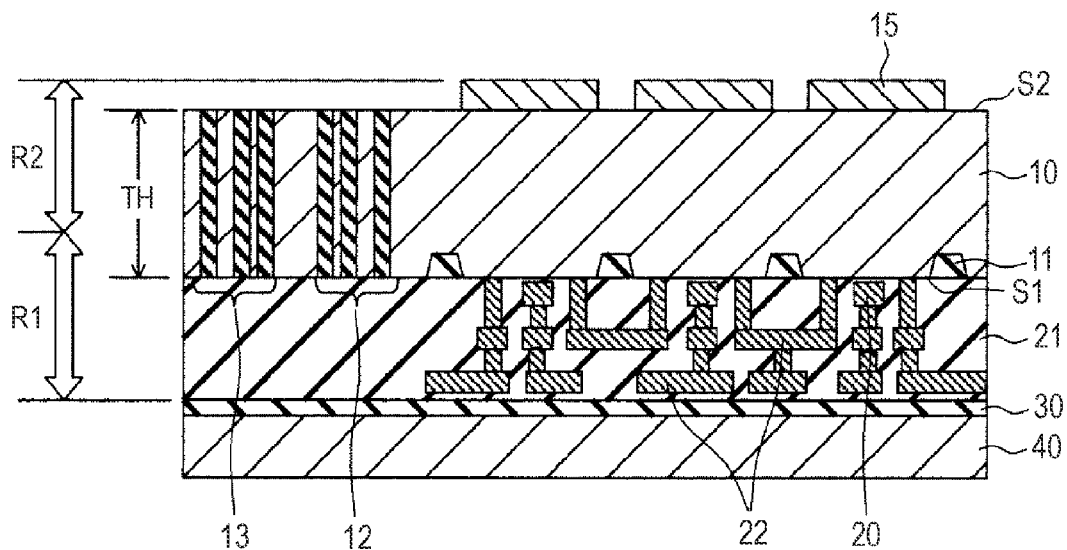

FIG. 3D is an enlarged view of a part Y of FIG. 3C. Films as the functional layers 15 are formed on the second surface S2 of the semiconductor substrate 10 bonded to the support substrate 40 in the above described manner. Then, a resist mask of a processing pattern is formed by applying a photoresist film, and performing overlay exposure on the circuit pattern of the semiconductor substrate 10, PEB (Post Exposure Bake), and developing treatment. Using this as a mask, processing treatment such as etching is performed, and thereby, the functional layers 15 having a desired function are formed.

Here, not only the method using the adhesive layer as a material for bonding, but also a method of forming oxide film materials on both the semiconductor substrate and the support substrate and bonding the semiconductor substrate and the support substrate by heating them is known. Further, the method of bonding the semiconductor substrate and the support substrate may be any method.

The overlay exposure on the circuit pattern of the above described semiconductor substrate is realized using an alignment optical system of the exposure equipment of detecting positions of rough alignment marks and fine alignment marks formed on the semiconductor substrate.

Figure 4:
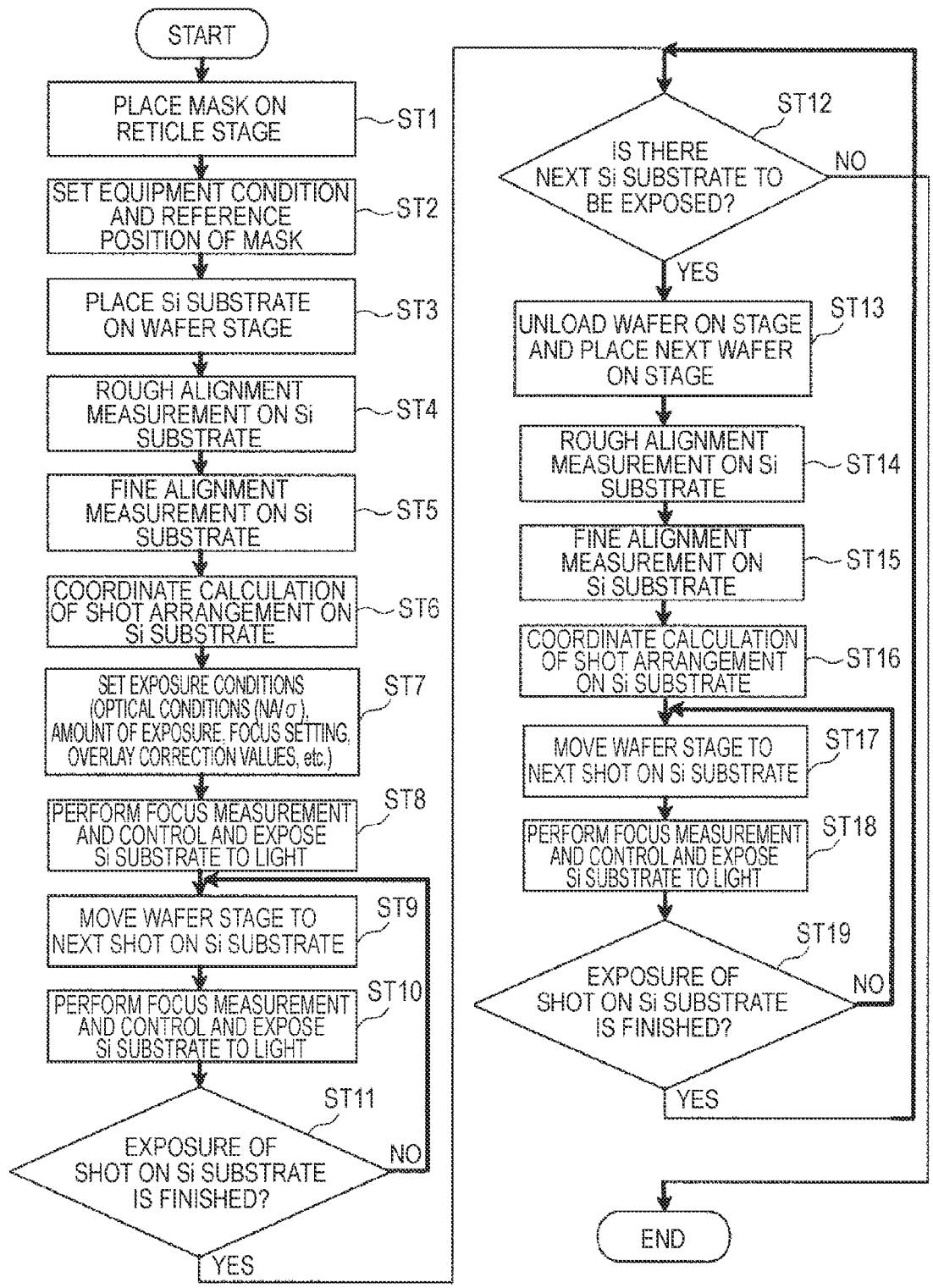
FIG. 4 is a flowchart of a process of performing overlay exposure of typical exposure equipment.

Here, FIG. 4 is a flowchart of a process of performing overlay exposure of typical exposure equipment. The process includes the first step ST1 to 19th step ST19.

First, the mask is placed on a reticle stage (ST1), the equipment condition and the reference position of the mask are set (ST2), and the semiconductor substrate is placed on a wafer stage (ST3).

Then, for example, as alignment measurement of the exposure equipment, first, the rough alignment marks formed on the scribe lines of the respective shots are measured (ST4), and the shot arrangement of the entire semiconductor substrate is calculated.

The fine alignment marks formed on the scribe lines of respective shots are measured (ST5), and offsets X, Y of the entire wafer, the wafer scaling X, Y, wafer rotation, and orthogonality are calculated. Thereby, the detailed shot arrangement is determined (ST6). Furthermore, three or more alignment marks formed at exposure of respective shots on the scribe lines are measured, and thereby, also the shot scaling factor, the shot orthogonality, and the shot rotation can be calculated.

Then, settings necessary for exposure are made (ST7), and mask patterns are sequentially transferred onto the semiconductor substrate (ST8 to ST11).

Then, the presence or absence of the semiconductor substrate to be exposed to light is determined (ST12) and, if it is present, the wafer is unloaded and a new substrate is placed on the wafer stage (ST13), and the same process as that described above is repeated (ST14 to ST19).

In the embodiment, the functional layers 15 are formed on the second surface S2 of the semiconductor substrate 10 in the above described manner. The functional layers 15 are formed according to the circuit pattern of the first surface.

For the purpose, when a pattern is exposed to light on the second surface, the alignment marks provided on the first surface are detected from the second surface side. Here, visible light is used as an alignment light source of exposure equipment, however, the transmittance of the alignment light for the semiconductor material such as silicon is low. For example, if the silicon layer of the semiconductor material becomes thicker than 800 nm, in the related art, the intensity of detection light of the alignment marks from the second surface side is drastically attenuated or may be impossible to be detected.

In the embodiment, the first alignment marks 12 and the second alignment marks 13 are formed on the scribe lines. Although the thickness TH of the semiconductor substrate 10 is equal to or more than 800 nm, the first alignment marks 12 and the second alignment marks 13 are formed through the semiconductor substrate 10, and the marks can be optically detected from the second surface side.

As described above, the second alignment marks are detected from the second surface side, and thus, in the case of an asymmetric alignment marks, for example, the marks are formed using a pattern reversed in advance at the formation from the first surface side so that the reversed pattern after bonding may be normally detected.

The reversal of the pattern of the second alignment marks will be described later in detail.

[Problem of Positional Shifts of Alignment Marks at Bonding]

On the other hand, in the technique of bonding the substrates in the above described manner, bonding shifts and bonding variations are produced at bonding of the semiconductor substrate and the support substrate.

The positional shifts are several micrometers to several tens of micrometers depending on outer shape variations of the semiconductor substrate and the support substrate and outer shape bonding accuracy between the substrates. Due to the bonding error or the like, it may be impossible to detect the rough alignment marks in predetermined positions of the exposure equipment.

This is mainly caused by bonding shifts of about 100 to 200 μm when the semiconductor substrate and the support substrate are bonded according to the outer shapes of the substrates. That is, the wafer map coordinates are pattern-shifted after bonding, and alignment errors of the exposure equipment are caused.

Fundamentally, the center of the wafer stage and the exposure shot map center of the exposure equipment should be coincident. However, they are shifted by several to several hundreds of micrometers because of adjustment of the exposure equipment and operation of production lines.

When the bonding processing is performed in this facility, the amounts of shift of the alignment marks become twice relatively.

The situation that the amounts of shift of the alignment marks become twice will be explained with reference to FIGS. 5A and 5B.

First, it is assumed that the amounts of shift between the wafer center and the shot map are X=+100 μm, Y=+100 μm.

Figure 5A:
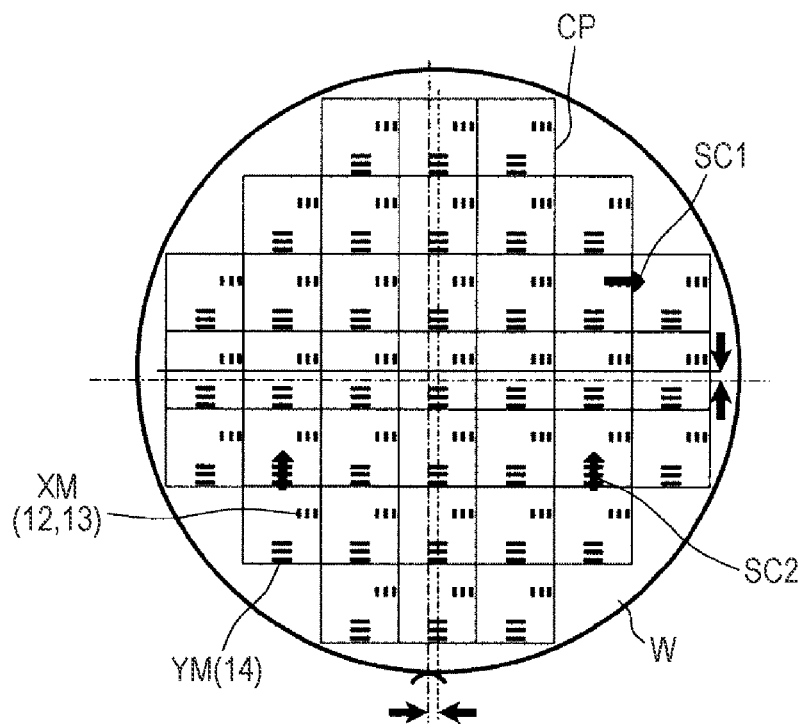
FIGS. 5A and 5B are diagrams for explanation of an amount of shift of alignment marks according to the first embodiment of the invention becoming relatively twice.

The shot map exposed to light in this condition is shown as in FIG. 5A. In FIG. 5A, a circuit pattern of semiconductor chips CP is formed on a semiconductor substrate (wafer W), Y-marks YM (14) and X-marks (XM) as rough alignment marks having asymmetric configurations are formed on the scribe lines. In the drawing, the region of the scribe lines is not clearly segmented for illustration from the regions to be the respective semiconductor chips.

The X-marks XM include the first alignment marks 12 and the second alignment marks 13.

Typically, the rough alignment mark length is 200 μm. The rough alignment marks are scanned and detected in the scanning directions (SC1, SC2) by the He—Ne laser in the region where the rough alignment marks are formed.

Subsequently, after the processing of the bonding process is performed, the wafer is reversed horizontally line-symmetrically at 180 degrees. This condition is as shown in FIG. 5B.

Figure 5B:
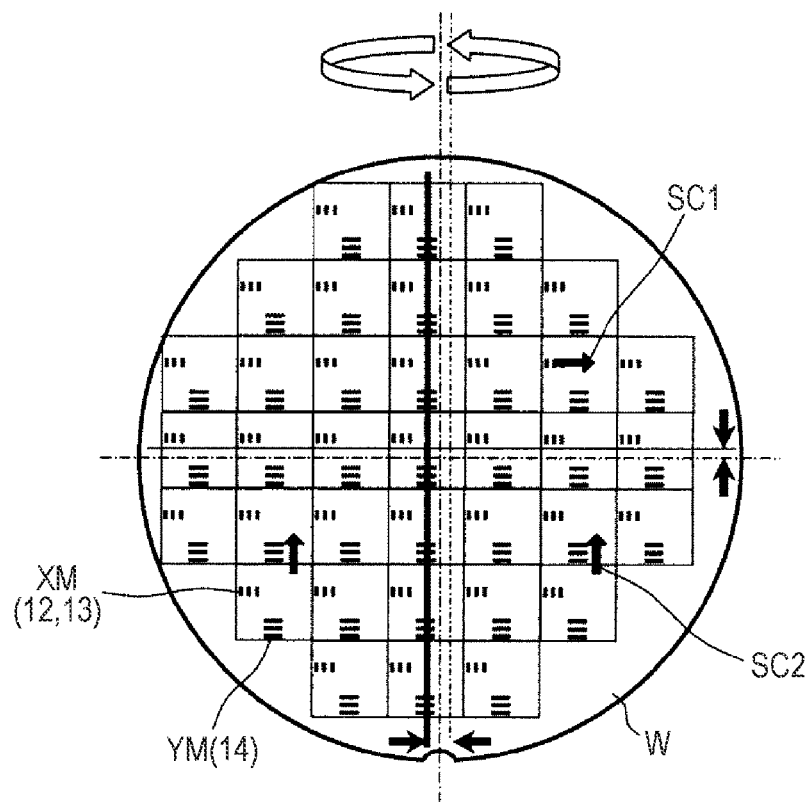

In this regard, the He—Ne laser that detects the rough alignment marks is scanned as shown in FIG. 5B, and the shot map on the support substrate is in a location relatively shifted by 200 μm and the shift due to bonding of the substrates is also added. That is, it is highly possible that the positions of the rough alignment marks are shifted by 200 µm or more.

Figure 6A:
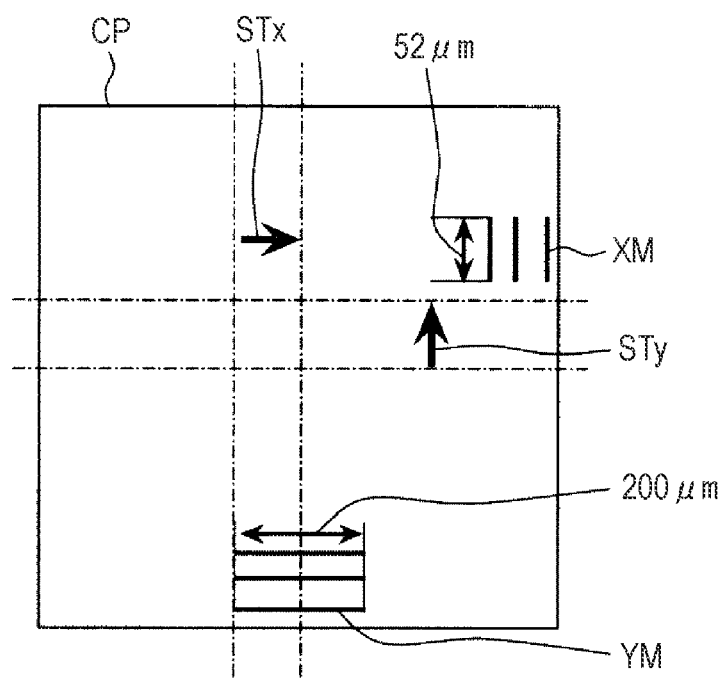
FIGS. 6A and 6B are schematic views showing a layout within one shot according to the first embodiment of the invention.
Figure 6B:
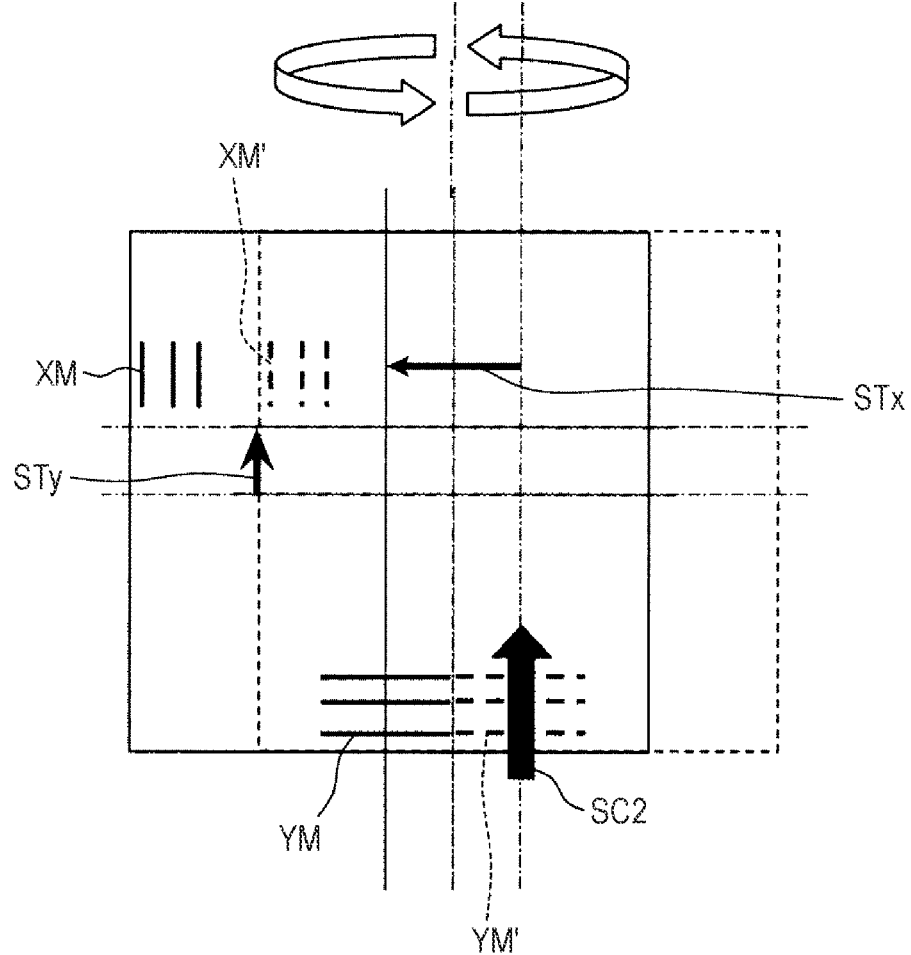

To make it more understandable, the layout within one shot is shown in FIGS. 6A and 6B. The region of the scribe lines is not clearly segmented for illustration from the regions to be the respective semiconductor chips.

Before bonding, the Y-marks YM and the X-marks XM has been formed in predetermined locations. Relative to the wafer center, the electronic pattern of the semiconductor chips CP is shifted by an X relative shift $ST_X$ and a Y relative shift $ST_Y$. Here, the Y-marks YM and the X-marks XM are formed to have lengths of 200 µm and 52 µm, respectively, for example. Thereby, if the shifts are equal to or less than the lengths, scanning of the alignment light for detecting the positions may be performed with no problem by the reflected light obtained at application of the alignment light.

On the other hand, after bonding, the exposure equipment has recognized that the alignment marks are present in the positions indicated by the Y-marks YM' and the X-marks XM', but, in fact, the alignment marks are present in the positions indicated by the Y-marks YM and the X-marks XM. The X-marks XM can be detected by taking the distance of scanning of the alignment light longer.

However, regarding the Y-marks YM, even when the distance of the scanning SC2 of the alignment light is made longer, the alignment light is not applied to the Y-marks YM. Accordingly, even when the alignment light is scanned for Y search by the He—Ne laser, no diffracted light is generated, no alignment signal is obtained, an error occurs, and the exposure operation is stopped.

Therefore, the operator should perform manual assist processing, and the productivity is significantly reduced.

[Details of Alignment Marks]

Specific examples of the Y-marks YM and the X-marks XM (12, 13) according to the embodiment will be explained.

FIGS. 7A to 7C are plan views respectively showing the specific examples of Y-marks YM and X-marks XM (12, 13).

As shown in FIG. 7A, the Y-marks YM include 67 rectangles of 3×4 µm as a unit of mark with a pitch of 6 µm in the X-direction. Three of these groups of patterns are arranged in the Y-direction at distances of 20 µm and 26 µm to form the Y-marks YM as rough alignment marks. In consideration of mark shifts containing bonding errors and the like, the mark length of the Y-marks YM as rough alignment marks of the exposure equipment are extended to 399 µm.

The pre-alignment accuracy of the exposure equipment (the accuracy for placement of the semiconductor substrate on the wafer stage of the exposure equipment) is equal to or less than 50 µm under normal control. By addition of the bonding error of the semiconductor substrate and the support substrate and the shift between the coordinate axis of the semiconductor substrate and the shot map of the exposure equipment, the accuracy may be estimated to be 300 µm. From the values, the mark shift of $\sqrt{\{(50/2)^2+(300/2)^2\}}=152$ µm is assumed after bonding. Further, if there is the mark length equal to or more than 152×2+52=356 µm containing the mark length of 52 µm at both sides, it is predicted that there is no problem. In the drawing, the mark length is set to 399 µm, for example.

On the other hand, X-marks XM include the first alignment marks 12 for the first surface and the second alignment marks 13 for the second surface as shown in FIGS. 7B and 7C.

The first alignment marks 12 and the second alignment marks 13 forming the X-mark XM include seven and 51 squares of 4×4 µm as a unit of mark with a pitch of 8 µm in the Y-direction, respectively. In consideration of the bonding errors and the like, the mark length of the second alignment marks 13 is extended to 404 µm. Since the first alignment marks 12 are marks used until before bonding, the length of 52 µm is sufficient.

Three of these groups of patterns are arranged at distances of 26 µm and 20 µm to form the first alignment marks 12, and three of these groups of patterns are arranged in the X-direction at distances of 20 µm and 26 µm to form the second alignment marks 13.

As described above, the second alignment marks as the X-marks XM and the Y-marks YM are designed by adding the bonding error of the semiconductor substrate and the support substrate and the shift between the coordinate axis of the semiconductor substrate and the shot map of the exposure equipment to the pre-alignment accuracy of the exposure equipment. Thereby, even when the shifts are produced, the alignment marks may be stably detected, the exposure operation may not be stopped, and the productivity may be improved.

According to the above described configuration, the first alignment marks 12 and the second alignment marks 13 contain asymmetric patterns with respect to the predetermined axis around which the bonded structure of the semiconductor substrate and the support substrate is reversed. Further, the first alignment marks 12 and the second alignment marks 13 in the asymmetric part have patterns reversed to each other with respect to the axis.

The X-marks XM including the first alignment marks 12 and the second alignment marks 13 and the Y-marks YM are formed through the semiconductor substrate 10. The first alignment marks 12 are used for the overlay alignment at the first surface S1 side, and the second alignment marks 13 are used for the overlay alignment at the second surface S2 side. The Y-marks YM are used for both the first surface S1 and the second surface S2.

Figure 8:
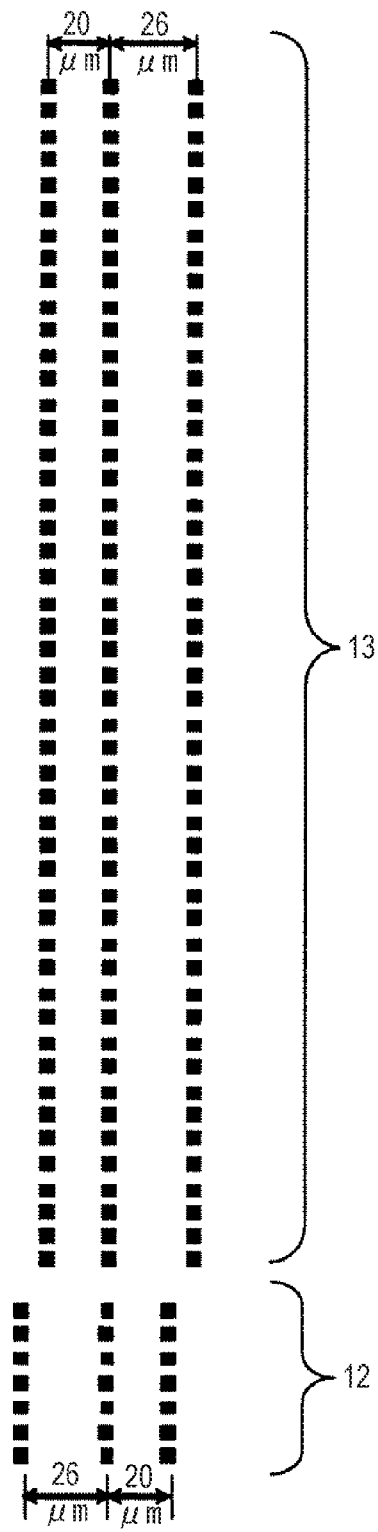
FIG. 8 is a plan view of first alignment marks and second alignment marks according to the first embodiment of the invention.

As shown in the plan view of FIG. 8, for example, the first alignment marks 12 and the second alignment marks 13 may be adjacently provided. In this case, for example, the layout in which the center mark patterns of the three mark patterns are on the same line may be formed.

[More Detailed Explanation of Manufacturing Method of Semiconductor Device]

Next, processes of a manufacturing method of a semiconductor device using a bonded substrate technology will be explained.

Figure 9A:
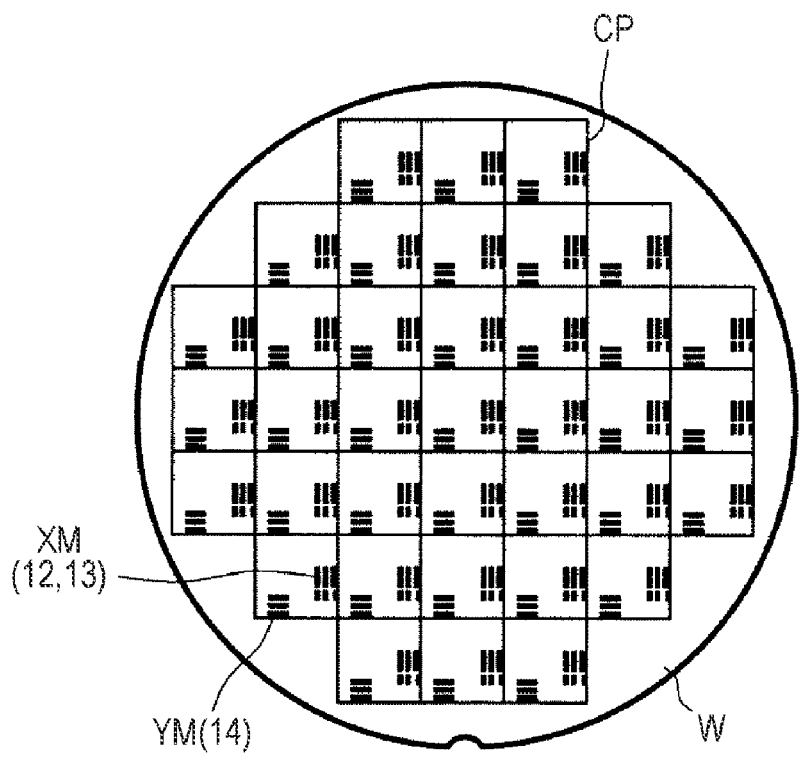
FIG. 9A is a plan view showing a process of a manufacturing method of the semiconductor device according to the first embodiment of the invention.
Figure 9B:
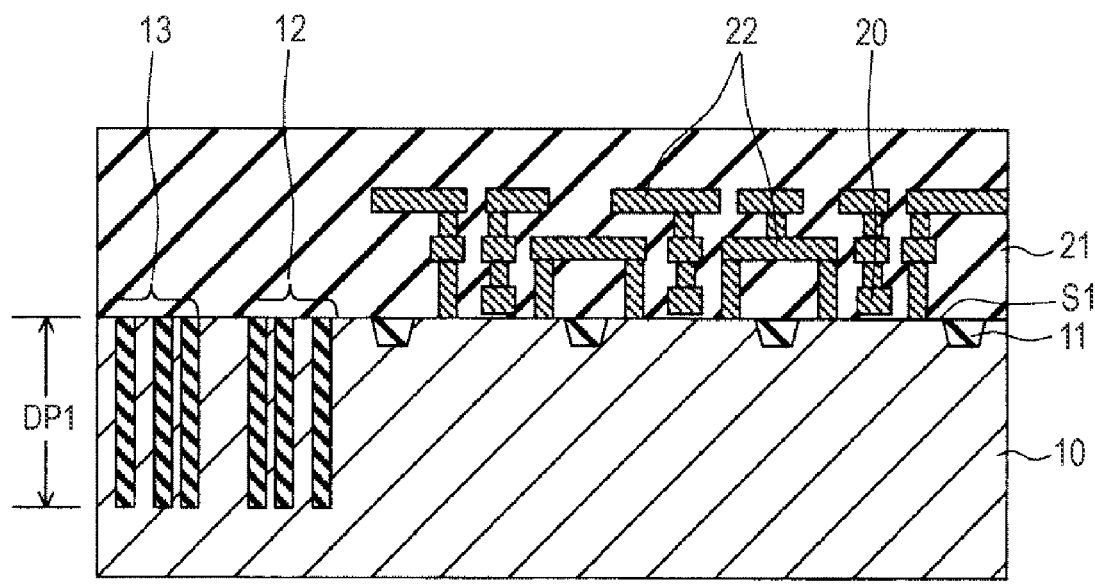
FIG. 9B is a sectional view.

FIG. 9A is a plan view showing a process of the manufacturing method of the semiconductor device of the embodiment, and FIG. 9B is a sectional view.

First, lithography processing is performed on the semiconductor substrate 10 using the mask of FIG. 1A. In the mask of FIG. 1A, for example, patterns with the X-marks XM including the first alignment marks 12 and the second alignment marks 13 and the Y-marks YM cut out are formed.

Other marks necessary for processing of the first surface and the second surface, alignment marks for measurement of overlay accuracy, and IPCQ patterns may be provided.

A resist mask is patterned on the semiconductor substrate 10 using the mask shown in FIG. 1A, etching processing is performed on the semiconductor substrate 10 to the depth deeper than 800 nm, and the opened patterns are filled with a material different from that of the semiconductor substrate 10. As the filling material, for example, silicon nitride or silicon oxide may be cited. Further, the patterns may be filled with a multilayer film structure containing polysilicon.

Here, there may be a stopper material at the depth providing a film thickness necessary for the semiconductor substrate 10.

Then, typical semiconductor devices are formed in the semiconductor on one surface with reference to the marks.

Using the alignment marks, transistors are formed by forming gate electrodes 20 via gate insulator films (not shown), and an insulator film 21 is formed in the upper layer thereof. Here, the upper layer wires 22 containing contacts are embedded in the insulator film 21.

The rough alignment marks used here include the first alignment marks 12 as the X-marks XM and the Y-marks YM, and, according to circumstances, alignment marks may be reformed in the respective steps of the first surface for use in alignment measurement of the exposure equipment. For example, the alignment marks are reformed in the openings of the contacts forming the upper layer wires and the upper layer wires 22 may be overlaid using the alignment marks.

For the alignment of the exposure equipment, the first alignment marks 12 as the X-marks XM and the Y-marks YM are used.

Figure 10A:
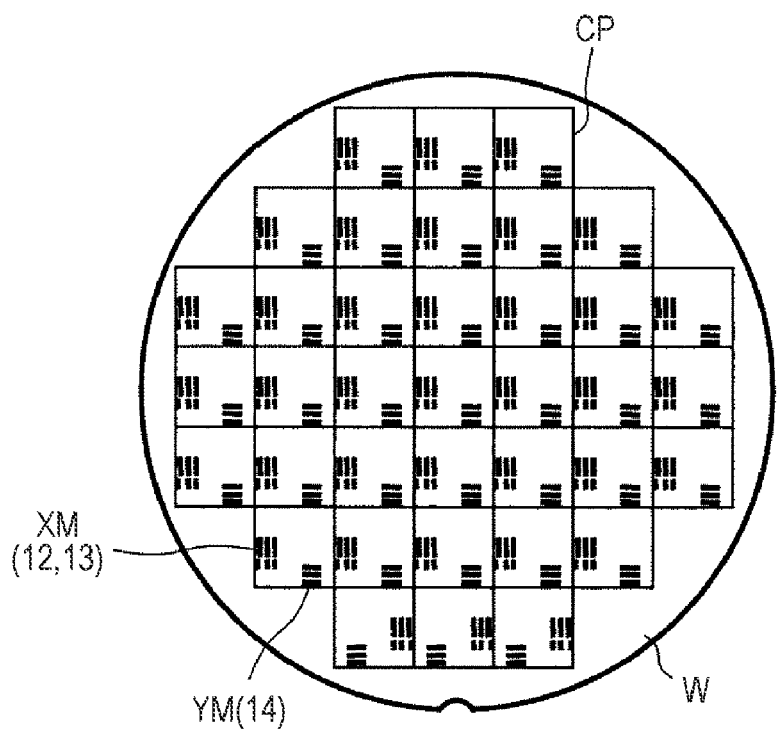
FIG. 10A is a plan view showing the process of the manufacturing method of the semiconductor device according to the first embodiment of the invention.
Figure 10B:
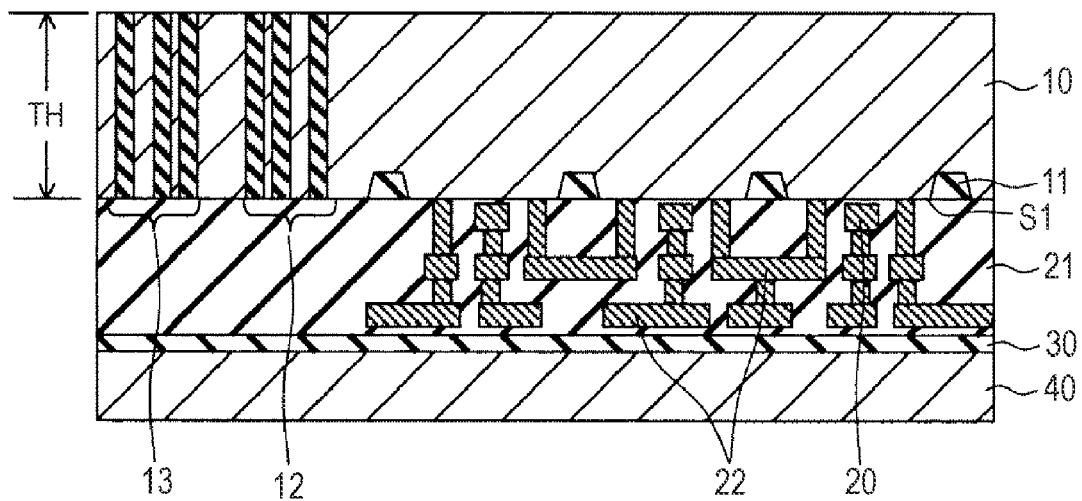
FIG. 10B is a sectional view.

FIG. 10A is a plan view showing the process of the manufacturing method of the semiconductor device of the embodiment, and FIG. 10B is a sectional view.

An adhesive layer 30 is applied onto the first surface S1 of the semiconductor substrate 10, the support substrate 40 is bonded thereto, and heating treatment is performed for the purpose of improvement of adhesion between the semiconductor substrate 10 and the support substrate 40.

Then, the semiconductor substrate 10 is ground from the rear surface and the semiconductor substrate 10 is finally made thinner to have a predetermined film thickness by wet-etching processing. Here, the thickness TH of the semiconductor substrate 10 is made thinner from 800 nm to 10 μm.

Here, the thickness TH of the semiconductor substrate 10 is equal to or more than 800 nm, and the transistors may be formed on one surface and elements having other functions may be formed or functional layers may be worked on the other surface.

Further, the thickness TH of the semiconductor substrate 10 after grinding is equal to or less than the depth DP of the grooves for forming the first alignment marks 12 and the second alignment marks 13, for example. Thereby, the first alignment marks 12 and the second alignment marks 13 may be formed through the semiconductor substrate 10.

The thinned bonded structure of the semiconductor substrate 10 and the support substrate 40 is rotated by 180 degrees line-symmetrically containing notches, the shot map of FIG. 10A is obtained.

Therefore, all pattern layouts on the wafer are mirror-reversed. Afterwards, when overlay of lithography on the wafer is performed, recreation (coordinate transformation) of shot maps, code transformation of X-coordinate values of the alignment mark coordinates, and the like should be performed.

At the subsequent step, the functional layers 15 are formed on the second surface S2 of the semiconductor substrate 10.

In the process after bonding, if overlay exposure is performed using the second alignment marks as the X-marks XM and the Y-marks YM, the exposure equipment can be operated as in the past without causing errors.

Additional functions may be added by subsequently performing working processing on the second surface of the semiconductor substrate after bonding in this manner, and high-performance semiconductor devices can be manufactured.

The working processing on the second surface S2 side may be performed after the application of the functional material or formation of the photoresist pattern, or deposition of the functional layer by the CVD or PVD method, or further, deposition of the functional layer, pattern formation of the photoresist, and the etching processing.

In the manufacturing method of the semiconductor device of the embodiment, in the case where the pattern is exposed to light on the second surface according to the circuit pattern of the first surface, the detection light of the alignment marks can be detected from the second surface side with high accuracy even when the semiconductor substrate of silicon is thicker than 800 nm.

First Example

Figure 11:
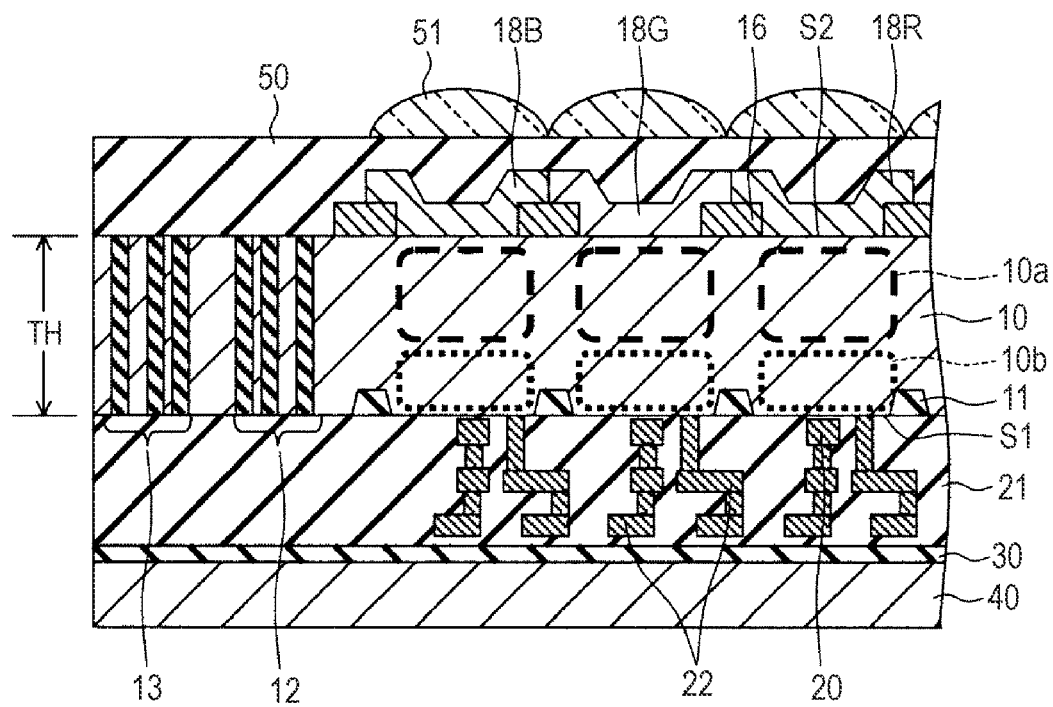
FIG. 11 is a sectional view in the process before separation of a semiconductor device according to the first example of the invention.

FIG. 11 is a sectional view in the process before separation of a semiconductor device according to the example.

In the manufacturing method of the semiconductor device according to the first embodiment, MOS transistors are formed on the first surface S1 of the semiconductor substrate 10, and photodiodes 10a are formed on the second surface.

Further, light shielding films 16 of a metal and red, green and blue color filters (18R, 18G, 18B) are formed on the second surface corresponding to the photodiodes, and a planarization film 50 and on-chip lenses 51 are formed on the upper layer thereof.

In the semiconductor substrate 10, diffusion layers 10b for holding photoelectric charge generated in the photodiodes are formed, and further, switches including the MOS transistor, wiring layers, and the like, and circuits of a signal amplification part, a signal processing part, etc. are formed.

In the above described manner, a CMOS image sensor in which pixels having photodiodes on a light receiving surface arranged in matrix can be manufactured.

The processes of formation of the photodiodes and the formation of the color filters, the light shielding films, the on-chip lenses, and the like on the second surface may be performed using the second alignment marks formed through the semiconductor substrate as shown in the first embodiment. That is, the transistors on the first surface S1, the photodiodes and the color filters on the second surface S2, and the like may be formed corresponding to the respective pixels of the image sensor.

Such an image sensor can take areas of photodiodes larger compared to those of the image sensor in the related art, and very high-sensitivity performance can be realized. In this way, by providing different functions to one surface and the other surface of the semiconductor substrate 10, the high-performance semiconductor device can be realized.

Second Embodiment

Explanation of Entire Semiconductor Device

Figure 12:
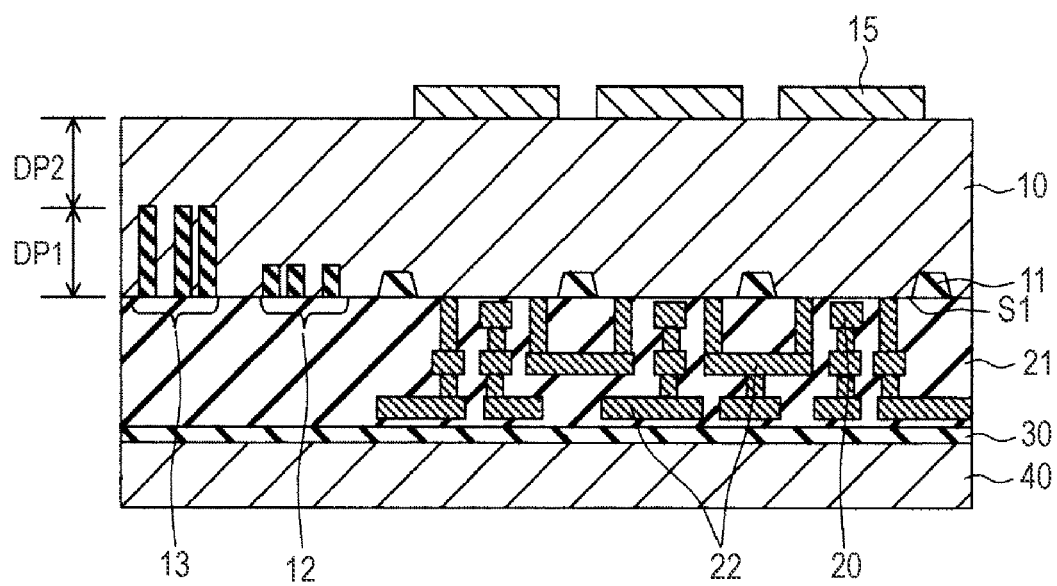
FIG. 12 is a sectional view of a part corresponding to semiconductor chips and scribe lines manufactured in a manufacturing method of a semiconductor device according to a second embodiment of the invention.

FIG. 12 is a sectional view of a part corresponding to semiconductor chips and scribe lines manufactured in a manufacturing method of a semiconductor device according to the embodiment.

For example, element isolation insulator films 11 are formed on the first surface S1 of a semiconductor substrate 10, gate electrodes 20 are formed via gate insulator films (not shown), and transistors as first elements are formed. An insulator film 21 is formed in the upper layer thereof, and upper layer wires 22 are embedded in the insulator film 21.

Onto the insulator film 21, a support substrate 40 is bonded via an adhesive layer 30.

The semiconductor substrate 10 is made thinner from the second surface S2 side, and functional layers 15 as the second elements or the second layers are formed on the second surface S2. The functional layers 15 are color filters, light shielding films, or the like, for example. Further, not the functional layers, but functional elements such as transistors may be formed on the second surface S2.

Furthermore, first alignment marks 12 and second alignment marks 13 are formed on the scribe lines.

In the embodiment, the first alignment marks 12 and the second alignment marks 13 do not penetrate the semiconductor substrate 10, and, for example, the second alignment marks 13 are formed at a depth of DP1 from the first surface S1. Further, a depth DP2 from the second surface S2 of the part of the second alignment marks 13 closest to the second surface S2 is equal to or less than 800 nm.

In the embodiment, the thickness of the semiconductor substrate 10 is the sum of the DP1 and the DP2, and equal to or more than 800 nm.

[Detailed Explanation of Manufacturing Method of Semiconductor Device]

Next, processes of a manufacturing method of a semiconductor device using a bonded substrate technology will be explained.

FIGS. 13A to 13D are sectional views showing a process of the manufacturing method of the semiconductor device of the embodiment. Further, FIGS. 14A and 14B are plan views of an exposure mask used in the manufacturing method of the semiconductor device of the embodiment.

Figure 13A:
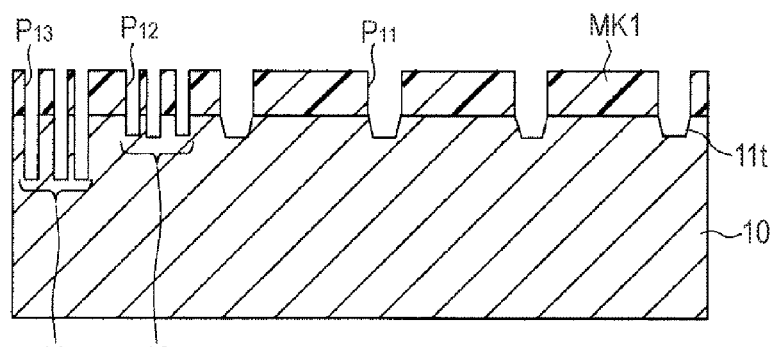
FIGS. 13A to 13D are sectional views showing a process of the manufacturing method of the semiconductor device according to the second embodiment of the invention.
Figure 14A:
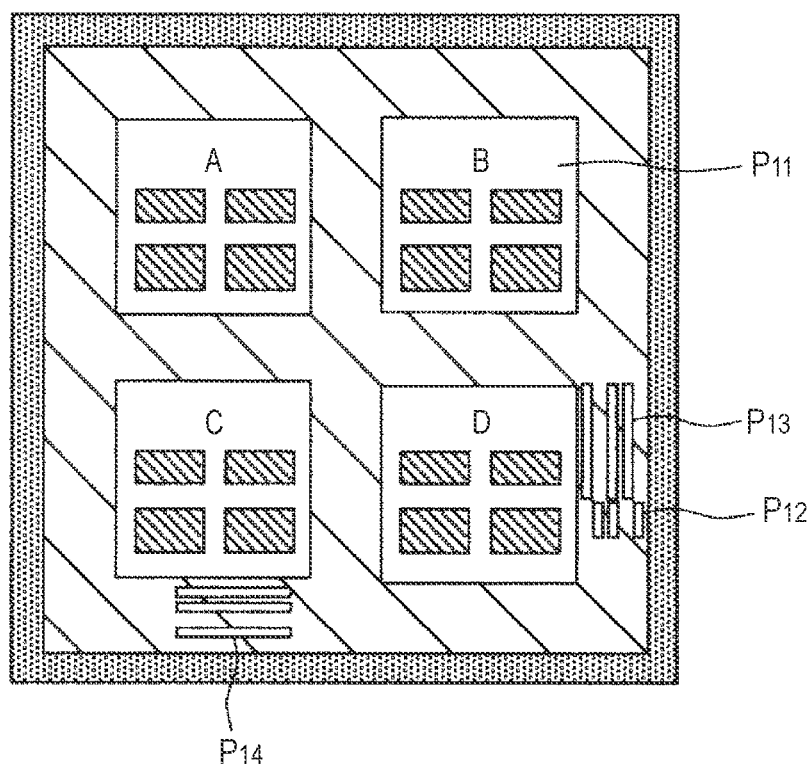
FIGS. 14A and 14B are plan views of an exposure mask used in the manufacturing method of the semiconductor device according to the second embodiment of the invention.

First, a resist mask MK1 is formed on the semiconductor substrate 10 as shown in FIG. 13A, and the semiconductor substrate 10 is patterned using the exposure mask shown in FIG. 14A. Thereby, element isolation regions $P_{11}$, first alignment mark regions $P_{12}$ and second alignment mark regions $P_{13}$ as X-marks, and Y-mark regions $P_{14}$ are opened. In the exposure mask, for example, a pattern in which X-marks XM including first alignment marks 12 and second alignment marks 13 and Y-marks YM are cut out is formed. Other marks necessary for processing of the first surface and the second surface, alignment marks for measurement of overlay accuracy, and IPCQ patterns may be provided.

Then, etching processing is performed using the resist mask MK1 opened in the pattern, element isolation grooves 11t, first alignment mark grooves 12t, second alignment mark grooves 13t, and Y-mark grooves (not shown) are formed.

Figure 13B:
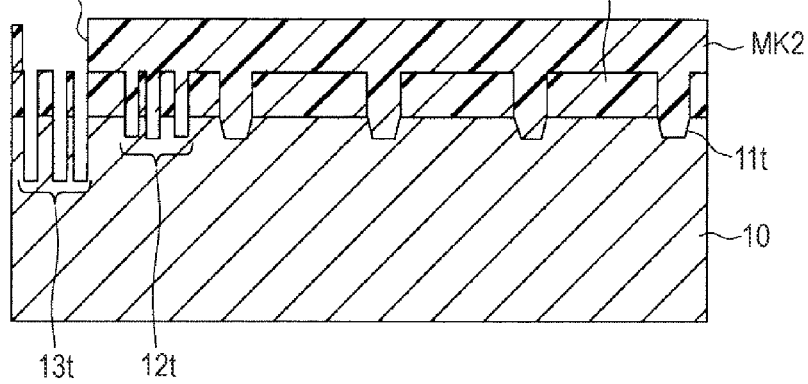
Figure 14B:
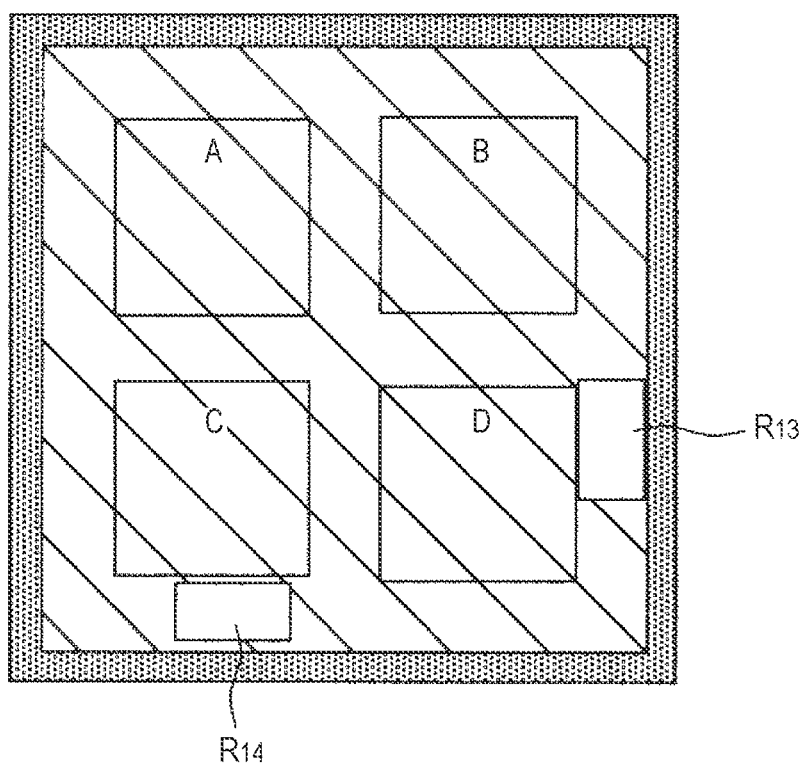

Then, as shown in FIG. 13B, a resist pattern MK2 is formed on the semiconductor substrate 10, and a pattern is opened using the exposure mask shown in FIG. 14B so that a second alignment mark region $R_{13}$ and a Y-mark region $R_{14}$ may be opened.

Figure 13C:
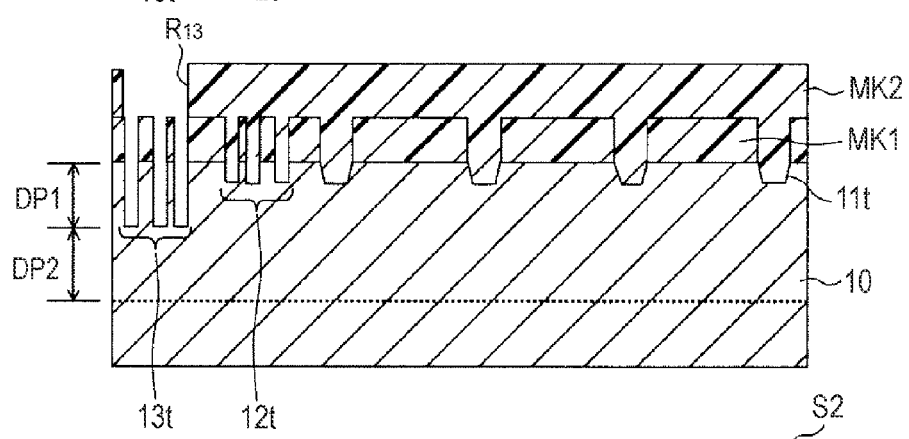

Then, as shown in FIG. 13C, etching processing is performed using the resist masks MK2 opened in the pattern, the second alignment mark grooves 13t and the Y-mark grooves (not shown) are worked more deeply. Here, etching under the condition for selectively removing silicon by etching is performed.

As the depth DP1, the grooves are worked deeply until the depth DP2 from the bottom part of the second alignment mark groove 13t to the location to be the second surface S2 is equal to or less than 800 nm. The first alignment mark grooves 12t may be made deep like the second alignment mark grooves 13t.

The sum of the DP1 and the DP2 is the thickness of the thinned semiconductor substrate, and the this is designed to be equal to or more than 800 nm.

Then, the resist masks MK1, MK2 are removed, and silicon oxide or the like is deposited by the CVD method or the like, for example, to fill the element isolation grooves 11t, the first alignment mark grooves 12t, the second alignment mark grooves 13t, and the Y-mark grooves (not shown). Then, the parts deposited outside the grooves are removed, and the element isolation insulator films 11, the first alignment marks 12, the second alignment marks 13, and the Y-marks (not shown) are formed.

Furthermore, transistors as first elements are formed by forming gate electrodes 20 via gate insulator films on the first surface S1 of the semiconductor substrate 10, and an insulator film 21 is formed in the upper layer thereof. Here, upper layer wires 22 containing contacts are embedded in the insulator film 21.

Onto the insulator film 21, a support substrate 40 is bonded via an adhesive layer 30.

Then, the semiconductor substrate 10 is ground from the second surface S2 for thinning. In this regard, the substrate is thinned until the depth DP2 from the bottom part of the second alignment marks 13 to the location to be the second surface S2 is equal to or less than 800 nm.

Figure 13D:
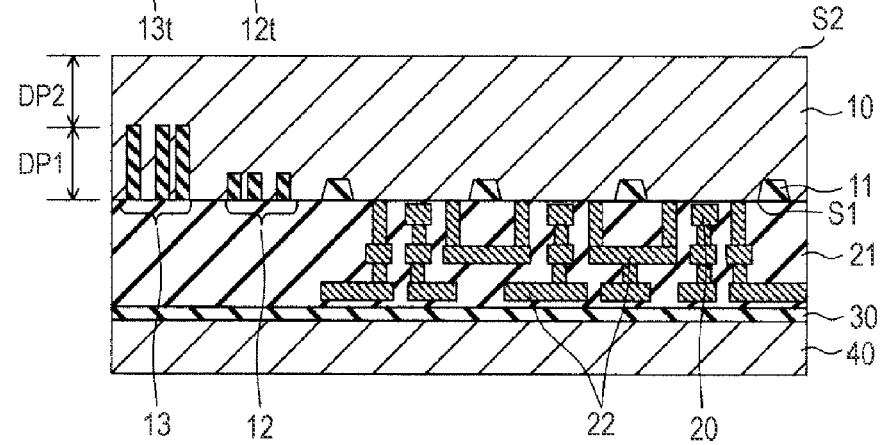

In this manner, the configuration shown in FIG. 13D may be obtained, and the positions of the second alignment marks are detected and films to be functional layers 15 are formed on the second surface S2 of the semiconductor substrate 10 in the subsequent processes.

In the embodiment, the first alignment marks 12 and the second alignment marks 13 are formed on the scribe lines. Since the depth DP2 from the bottom part of the second alignment marks 13 to the second surface S2 is made equal to or less than 800 nm, the thickness of the semiconductor substrate 10 is equal to or more than 800 nm, and the second alignment marks 13 can be optically detected from the second surface side.

As described above, the second alignment marks are detected from the second surface side, and thus, for example, in the case of asymmetric alignment marks, in order that the reversed pattern after bonding can be normally detected, the mark is formed in the pattern reversed in advance when it is formed from the first surface side.

As the manufacturing method of the semiconductor device of the embodiment, the details other than those described above may be performed as is the case of the first embodiment.

In the manufacturing method of the semiconductor device according to the embodiment, when the pattern is exposed to light on the second surface according to the circuit pattern of the first surface, even when the semiconductor substrate of silicon is thicker than 800 nm, the detection light of the alignment marks from the second surface side can be detected with high accuracy.

Third Embodiment

Explanation of Entire Semiconductor Device

Figure 15:
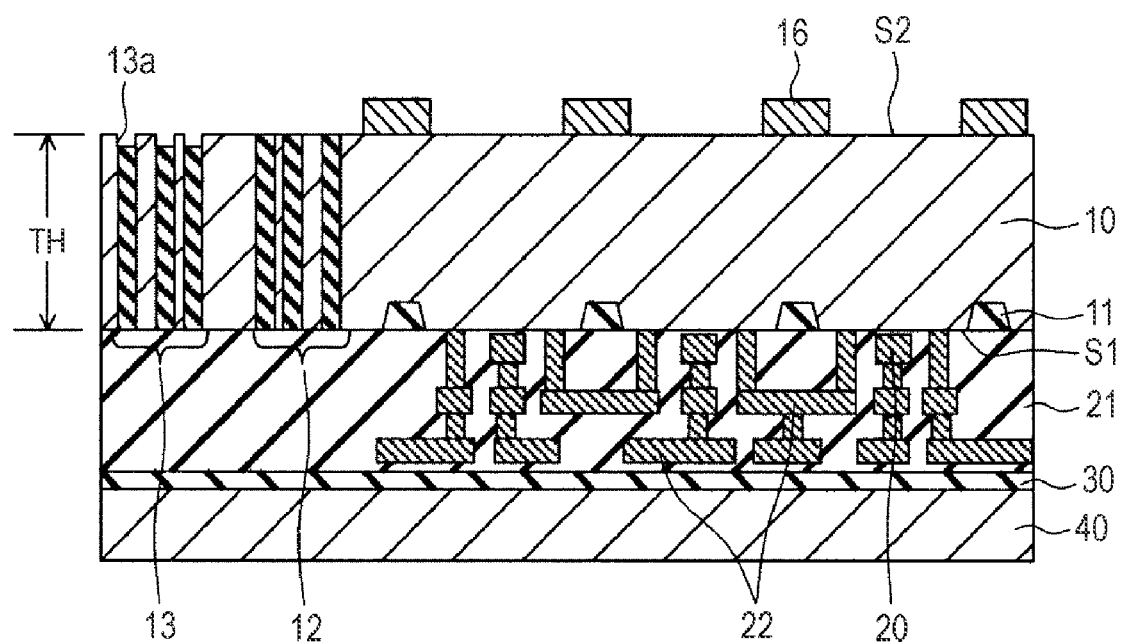
FIG. 15 is a sectional view of a part corresponding to semiconductor chips and scribe lines manufactured in a manufacturing method of a semiconductor device according to a third embodiment of the invention.

FIG. 15 is a sectional view of a part corresponding to semiconductor chips and scribe lines manufactured in a manufacturing method of a semiconductor device in the embodiment.

For example, element isolation insulator films 11 are formed on the first surface S1 of a semiconductor substrate 10, and gate electrodes 20 are formed via gate insulator films (not shown), and transistors as first elements are formed. An insulator film 21 is formed in the upper layer thereof, and upper layer wires 22 are embedded in the insulator film 21.

Onto the insulator film 21, a support substrate 40 is bonded via an adhesive layer 30.

The semiconductor substrate 10 is made thinner from the second surface S2 side, and light shielding films 16 are patterned on the second surface S2. In addition to the light shielding films 16, functional layers as the second elements or the second layers may be further formed, and functional elements such as transistors may be formed.

Furthermore, first alignment marks 12 and second alignment marks 13 are formed on the scribe lines.

In the embodiment, the thickness TH of the semiconductor substrate 10 is equal to or more than 800 nm, and the parts of the first alignment marks 12 and the second alignment marks 13 closest to the second surface S2 are exposed at the second surface side. That is, the first alignment marks 12 and the second alignment marks 13 are formed to penetrate the semiconductor substrate 10.

Further, a part of the second alignment marks 13 exposed on the second surface S2 side is removed, and concave-convex shapes corresponding to the pattern of the second alignment marks 13 are formed on the second surface S2.

[Detailed Explanation of Manufacturing Method of Semiconductor Device]

Next, processes of a manufacturing method of a semiconductor device using a bonded substrate technology will be explained.

FIGS. 16A to 16C are sectional views showing a process of the manufacturing method of the semiconductor device of the embodiment.

The processes to FIGS. 10A and 10B are the same as those in the first embodiment.

Then, as shown in FIG. 16A, a resist mask MK3 is formed on the semiconductor substrate 10, and a pattern is opened using to open the second alignment mark regions and the like. Further, etching processing is performed using the resist mask MK3, for example, and a part of the second alignment marks 13 is removed, and concave-convex shapes corresponding to the pattern of the second alignment marks 13 are formed on the second surface S2.

Then, as shown in FIG. 16B, a light shielding film 16 made of a metal such as aluminum is formed on the entire surface by PVD or CVD method, for example. Onto the light shielding film 16, concave-convex shapes 13a corresponding to the pattern of the second alignment marks 13 are transferred.

Then, as shown in FIG. 16C, positions of the concave-convex shapes 13a corresponding to the pattern of the second alignment marks 13 are detected, and a resist mask MK4 is patterned on the light shielding film 16.

Since the light shielding film 16 shields light, alignment has been difficult when the light shielding film 16 is worked, however, alignment can be performed easily by the detection of the positions of the concave-convex shapes 13a corresponding to the pattern of the second alignment marks 13.

In the subsequent process, etching processing is performed using the resist mask MK4, and the light shielding film 16 is patterned.

In the embodiment, the first alignment marks 12 and the second alignment marks 13 are formed on the scribe lines. The first alignment marks 12 and the second alignment marks 13 are formed through the semiconductor substrate 10 and thickness of the semiconductor substrate 10 is equal to or more than 800 nm, however, the second alignment marks 13 can be optically detected from the second surface side.

As described above, the second alignment marks are detected from the second surface side, and thus, for example, in the case of asymmetric alignment marks, in order that the reversed pattern after bonding can be normally detected, the marks are formed in the pattern reversed in advance when they are formed from the first surface side.

As the manufacturing method of the semiconductor device according to the embodiment, the details other than those described above may be performed as is the case of the first embodiment.

In the manufacturing method of the semiconductor device of the embodiment, when the pattern is exposed to light on the second surface according to the circuit pattern of the first surface, even when the semiconductor substrate of silicon is thicker than 800 nm, the detection light of the alignment marks from the second surface side can be detected with high accuracy.

Fourth Embodiment

Explanation of Entire Semiconductor Device

Figure 17:
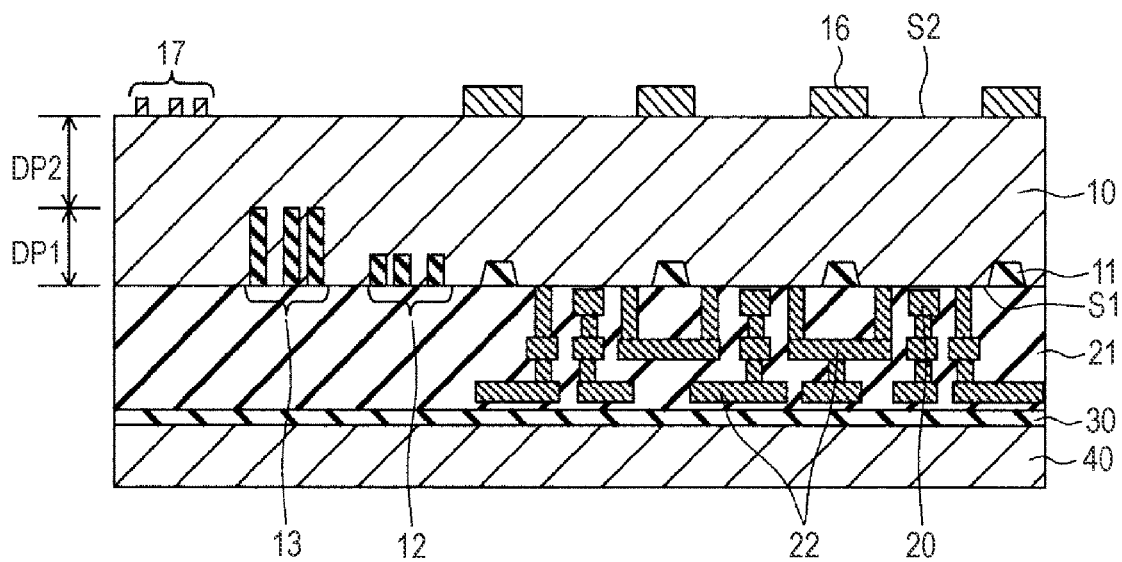
FIG. 17 is a sectional view of a part corresponding to semiconductor chips and scribe lines manufactured in a manufacturing method of a semiconductor device according to a fourth embodiment of the invention.

FIG. 17 is a sectional view of a part corresponding to semiconductor chips and scribe lines manufactured in a manufacturing method of a semiconductor device in the embodiment.

For example, element isolation insulator films 11 are formed on the first surface S1 of a semiconductor substrate 10, and gate electrodes 20 are formed via gate insulator films (not shown), and transistors as first elements are formed. An insulator film 21 is formed in the upper layer thereof, and upper layer wires 22 are embedded in the insulator film 21.

Onto the insulator film 21, a support substrate 40 is bonded via an adhesive layer 30.

The semiconductor substrate 10 is made thinner from the second surface S2 side, and light shielding films 16 are patterned on the second surface S2. In addition to the light shielding films 16, functional layers as the second elements or the second layers may be further formed, and functional elements such as transistors may be formed.

Furthermore, first alignment marks 12 and second alignment marks 13 are formed on the scribe lines.

In the embodiment, the first alignment marks 12 and the second alignment marks 13 do not penetrate the semiconductor substrate 10, and, for example, the second alignment marks 13 is formed at a depth of DP1 from the first surface S1. Further, a depth DP2 from the second surface S2 of the part of the second alignment marks 13 closest to the second surface S2 is equal to or less than 800 nm.

In the embodiment, the thickness of the semiconductor substrate 10 is the sum of the DP1 and the DP2, and equal to or more than 800 nm.

Furthermore, third alignment marks 17 are formed on the second surface S2 of the semiconductor substrate 10 in alignment using the second alignment marks 13.

For example, when the second elements of the light shielding films 16 and the like are formed on the second surface S2, the second elements may be formed in alignment with the second alignment marks 13 by alignment using the third alignment marks 17.

[Detailed Explanation of Manufacturing Method of Semiconductor Device]

Next, processes of a manufacturing method of a semiconductor device using a bonded substrate technology will be explained.

Figure 18A:
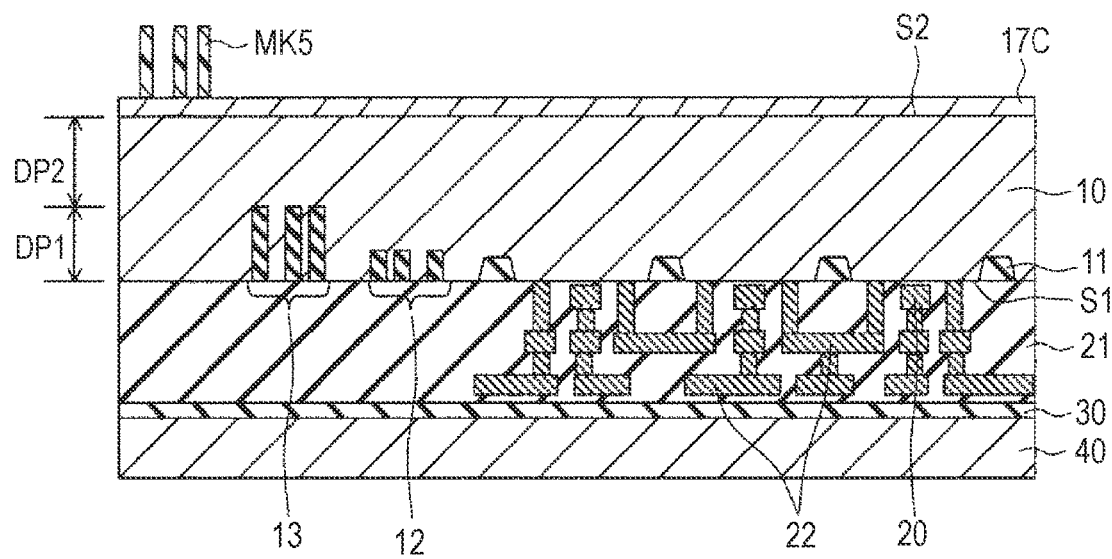
FIGS. 18A and 18B are sectional views showing a process of the manufacturing method of the semiconductor device according to the fourth embodiment of the invention.
Figure 18B:
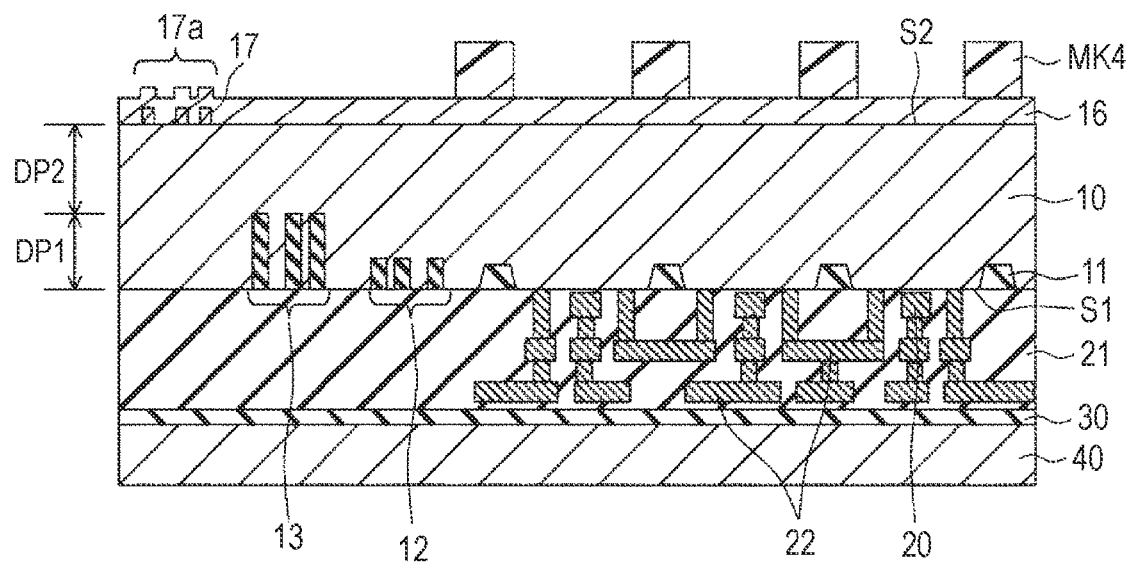

FIGS. 18A and 18B are sectional views showing a process of the manufacturing method of the semiconductor device of the embodiment.

The processes to FIG. 13D are the same as those in the second embodiment.

Then, as shown in FIG. 18A, a film 17c to be third alignment marks is formed on the second surface S2 by the CVD method or the like, for example, and a resist mask MK5 is patterned in alignment with the second alignment marks 13.

Then, as shown in FIG. 18B, etching processing is performed using the resist mask MK5, for example, and the third alignment marks 17 having convex shapes are formed on the second surface S2 of the semiconductor substrate 10.

Then, a light shielding film 16 made of a metal such as aluminum is formed on the entire surface by PVD or CVD method, for example. Onto the light shielding film 16, concave-convex shapes 17a corresponding to the pattern of the third alignment marks 17 are transferred.

Then, positions of the concave-convex shapes 17a corresponding to the pattern of the third alignment marks 17 are detected, and a resist mask MK4 is patterned on the light shielding film 16.

Since the light shielding film 16 shields light, alignment has been difficult when the light shielding film 16 is worked, however, alignment can be performed easily by the detection of the positions of the concave-convex shapes 17a corresponding to the pattern of the third alignment marks 17.

In the subsequent process, etching processing is performed using the resist mask MK4, and the light shielding film 16 is patterned.

In the first alignment marks 12 and the second alignment marks 13 are formed on the scribe lines. Since the depth DP2 from the bottom part of the second alignment marks 13 to the second surface S2 is made equal to or less than 800 nm, the thickness of the semiconductor substrate 10 is equal to or more than 800 nm, and the second alignment marks 13 can be optically detected from the second surface side.

Furthermore, since the light shielding film 16 shields light, alignment has been difficult when the light shielding film 16 is worked, however, alignment can be performed easily by the detection of the positions of the concave-convex shapes 17a corresponding to the pattern of the third alignment marks 17.

As described above, the second alignment marks are detected from the second surface side, and thus, for example, in the case of asymmetric alignment marks, in order that the reversed pattern after bonding can be normally detected, the mark is formed in the pattern reversed in advance when they are formed from the first surface side.

As the manufacturing method of the semiconductor device according to the embodiment, the details other than those described above may be performed as is the case of the first embodiment.

In the manufacturing method of the semiconductor device according to the embodiment, when the pattern is exposed to light on the second surface according to the circuit pattern of the first surface, even when the semiconductor substrate of silicon is thicker than 800 nm, the detection light of the alignment marks from the second surface side can be detected with high accuracy.

Second Example

Figure 19:
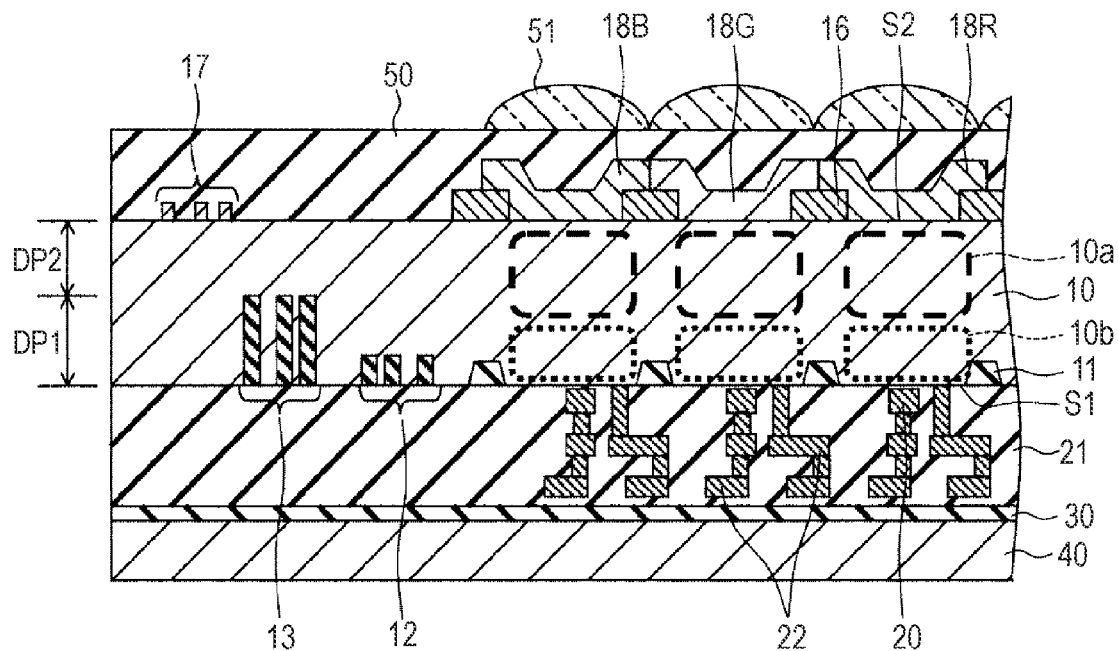
FIG. 19 is a sectional view in the process before separation of a semiconductor device according to a second example of the invention.

FIG. 19 is a sectional view in the process before separation of a semiconductor device according to the example.

In the manufacturing method of the semiconductor device according to the fourth embodiment, MOS transistors are formed on the first surface S1 of the semiconductor substrate 10, and photodiodes 10a are formed on the second surface.

Further, light shielding films 16 of a metal and red, green and blue color filters (18R, 18G, 18B) are formed on the second surface corresponding to the photodiodes, and a planarization film 50 and on-chip lenses 51 are formed on the upper layer thereof.

In the semiconductor substrate 10, diffusion layers 10b for holding photoelectric charge generated in the photodiodes are formed, and further, switches including the MOS transistor, wiring layers, and the like, and circuits of a signal amplification part, a signal processing part, etc. are formed.

In the above described manner, a CMOS image sensor in which pixels having photodiodes on a light receiving surface arranged in matrix can be manufactured.

The processes of formation of the photodiodes, the formation of the color filters, and the like on the second surface may be performed using the third alignment marks 17 as shown in the fourth embodiment. That is, the transistors on the first surface S1, the photodiodes on the second surface S2, the color filters, and the like may be formed corresponding to the respective pixels of the image sensor.

Such an image sensor can take areas of photodiodes larger compared to those of the image sensor in the related art, and very high-sensitivity performance can be realized. In this way, by providing different functions to one surface and the other surface of the semiconductor substrate 10, the high-performance semiconductor device can be realized.

Fifth Embodiment

In arrangement of marks for the front surface and the rear surface as mark arrangement of bonded substrates, it is necessary to provide alignment marks, overlay measurement marks, other marks (patterns) on both surfaces, and a problem that the area occupied by the marks in the scribe line region becomes larger arises.

If it may be impossible to provide a necessary mark (pattern) on the scribe lines, the scribe line width should be made wider so that the mark (pattern) may be provided, and the theoretical yield of chips becomes lower. Thereby, the chip cost rises.

Figure 20:
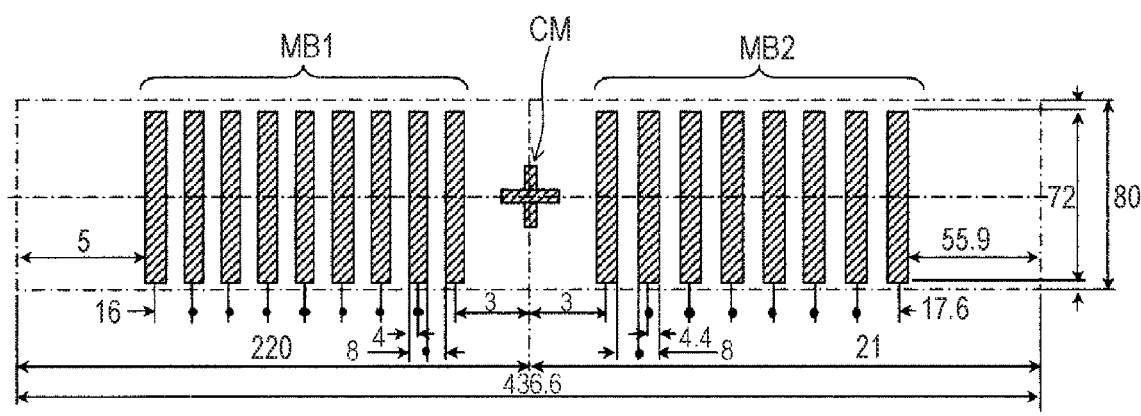
FIG. 20 is a plan view of an example of alignment marks of exposure equipment.

FIG. 20 is a plan view of an example of alignment marks of exposure equipment.

The alignment marks in FIG. 20 have a symmetric first mark block MB1 with 8 μm-width/16 μm-pitch, and a symmetric second mark block MB2 with 4.4 μm-width/8.8 μm-pitch. A center mark CM is formed between the first mark block MB1 and the second mark block MB2.

The marks as a whole are asymmetric with respect to a predetermined axis around which the bonded structure of the support substrate and the semiconductor substrate is reversed.

The alignment marks in FIG. 20 are for use with an alignment light source of a laser beam having a visible light range wavelength, and provided along the X-axis and the Y-axis, respectively.

In the case where the asymmetric alignment marks in FIG. 20 are turned into a reversed pattern, it may be impossible for the exposure equipment to recognize them as marks. Here, the entire length of the marks is 436.6 μm.

After bonding, if there are four steps that should be overlaid on the steps before bonding, for example, the scribe line length of 1746.4 μm should be excessively provided.

In the scribe line region, not only the alignment marks but also overlay measurement marks, and IPQC patterns and 1PC (First Pellet Check) circuits in the other processes are provided. Accordingly, it may be difficult to further provide the long alignment marks necessary after bonding.

Figure 21A:
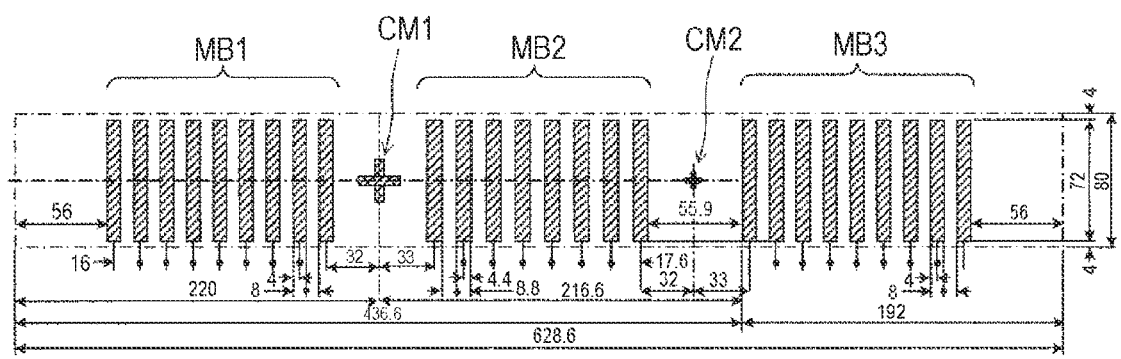
FIG. 21A is a plan view of alignment marks according to a fifth embodiment of the invention.

FIG. 21A is a plan view of alignment marks according to the embodiment.

The alignment marks have a symmetric first mark block MB1 with 8 μm-width/16 μm-pitch, a symmetric second mark block MB2 with 4.4 μm-width/8.8 μm-pitch, and asymmetric third mark block MB3 with 8 μm-width/16 μm-pitch. The second mark block MB2 is provided between the first mark block MB1 and the third mark block MB3.

Further, a first center mark CM1 is formed between the first mark block MB1 and the second mark block MB2, and a second center mark CM2 is formed between the second mark block MB2 and the third mark block MB3.

Here, in the process before bonding, in the alignment marks shown in FIG. 21A, the exposure equipment can be operated by inputting coordinates of the first center mark CM1.

Figure 21B:
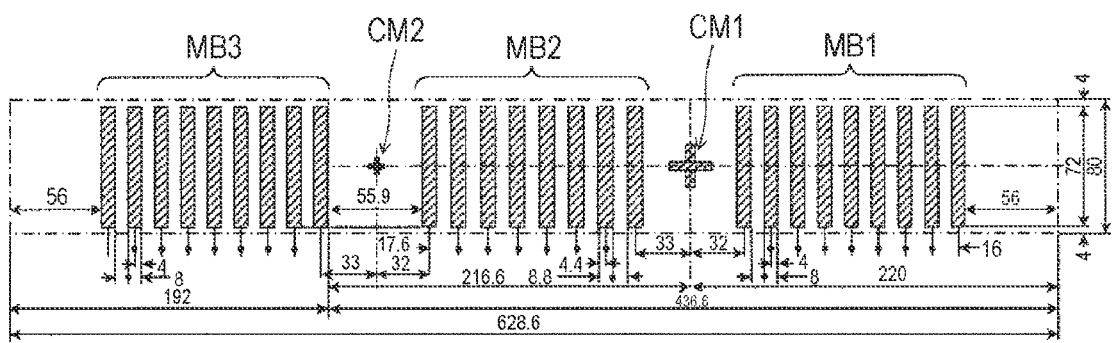
FIG. 21B is a reversed plan view.

Then, by bonding, the alignment marks in FIG. 21A are reversed as in FIG. 21B.

Accordingly, regarding the alignment marks of the exposure equipment after the bonding process, in the alignment marks shown in FIG. 21B, the alignment operation can be performed by inputting coordinates of the second center mark CM2.

In the alignment marks according to the embodiment, the length occupied by the alignment marks of the scribe region in the related art in the bonded substrates can be reduced from 873.2 μm (=436.6×2) to 628.6 μm.

The alignment marks according to the embodiment are symmetric as mark blocks by newly adding the third mark block to the asymmetric alignment marks in the related art.

Note that, since the first center mark CM1 and the second center mark CM2 are different, whether the reversed pattern or not can be determined.

Further, in alignment measurement, alignment is measured using the first mark block MB1 and the second mark block MB2 under the unreversed condition before bonding. That is, the first mark block MB1 and the second mark block MB2 correspond to the first alignment marks.

Further, alignment is measured using the third mark block MB3 and the second mark block MB2 under the reversed condition after bonding. That is, the third mark block MB3 and the second mark block MB2 correspond to the second alignment marks.

In the manufacturing method of the semiconductor device of the embodiment, in the case where the pattern is exposed to light on the second surface according to the circuit pattern of the first surface, the detection light of the alignment marks can be detected with high accuracy even when the semiconductor substrate of silicon is thicker than 800 nm.

The embodiment can be applied to the first to fourth embodiments.

Sixth Embodiment

Figure 22A:
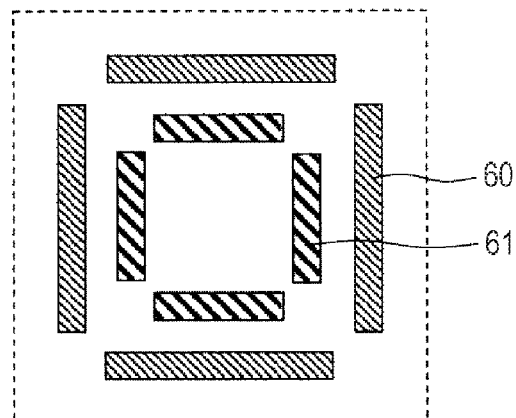
FIGS. 22A to 22C are plan views of alignment marks for overlay accuracy measurement.

An overlay accuracy measurement mark is a pattern in FIG. 22A, for example, and includes main-measures 60 and sub-measures 61. For example, overlay accuracy is determined by discriminating overlapping or the like of the main-measures 60 formed at the former step with the sub-measures 61 formed at the latter step.

The pattern in FIG. 22A is symmetric with respect to a predetermined axis around which the bonded structure of the support substrate and the semiconductor substrate is reversed.

Figure 22B:
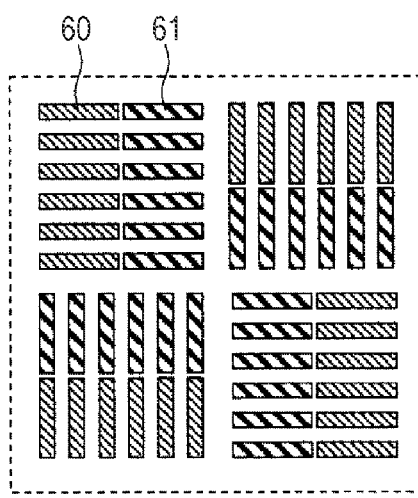

FIG. 22B shows a pattern with further improved accuracy of the overlay accuracy measurement, including main-measures 60 and sub-measures 61.

Figure 22C:
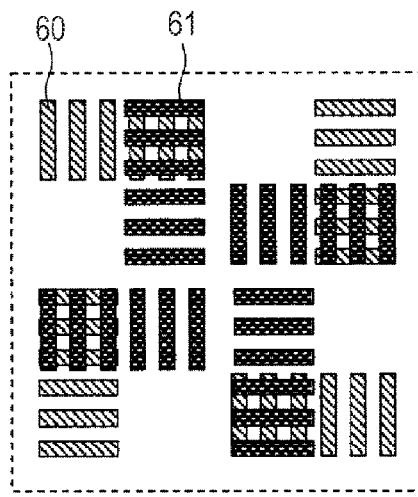

Unlike the pattern in FIG. 22A, this pattern is asymmetric with respect to the predetermined axis around which the bonded structure of the support substrate and the semiconductor substrate is reversed. For example, when the unreversed sub-measures 61 are overlaid on the reversed main-measures 60, a pattern shown in FIG. 22C is obtained, and it may be impossible to measure the overlay accuracy.

Figure 23A:
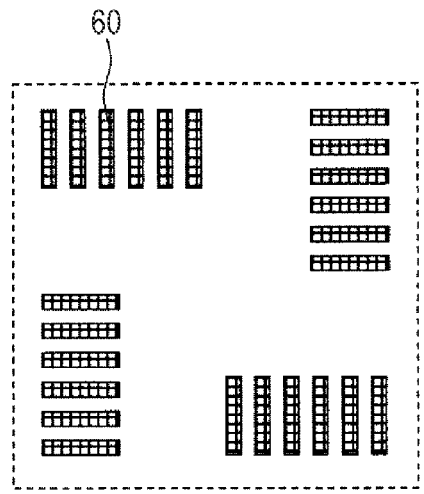
FIGS. 23A to 23C are plan views of alignment marks for overlay accuracy measurement according to a sixth embodiment of the invention.
Figure 23B:
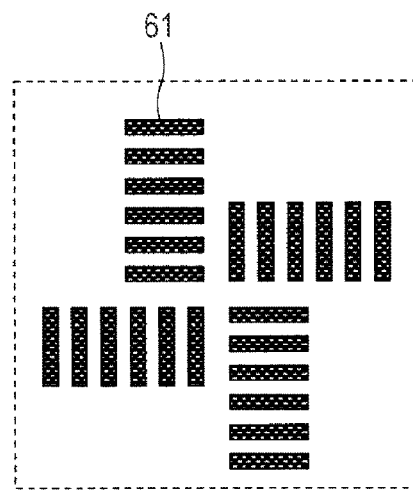

In the embodiment, the main-measures 60 that have been reversed in advance as shown in FIG. 23A and the unreversed sub-measures 61 as shown in FIG. 23B are used.

Figure 23C:
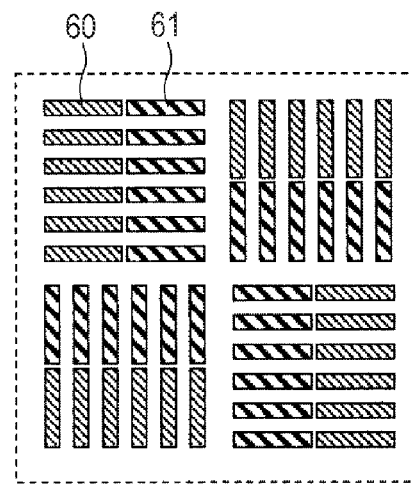

When the main-measures 60 that have been reversed in advance as shown in FIG. 23A become a reversed pattern by the bonding of the substrates, if the unreversed sub-measures 61 are overlaid, a pattern shown in FIG. 23C is obtained. In this case, the measurement can be made with high accuracy but with no problem.

A method of forming an overlay accuracy measurement pattern between steps before bonding and forming an overlay accuracy measurement pattern between the step before bonding and the step after bonding will be explained.

Figure 24A:
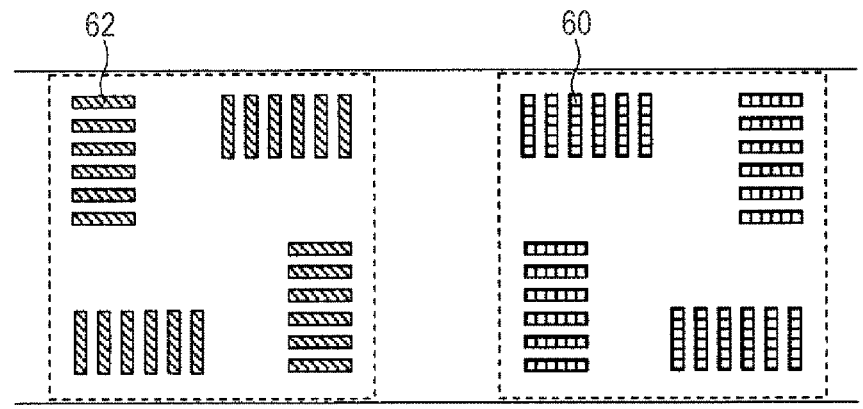
Figure 24A:
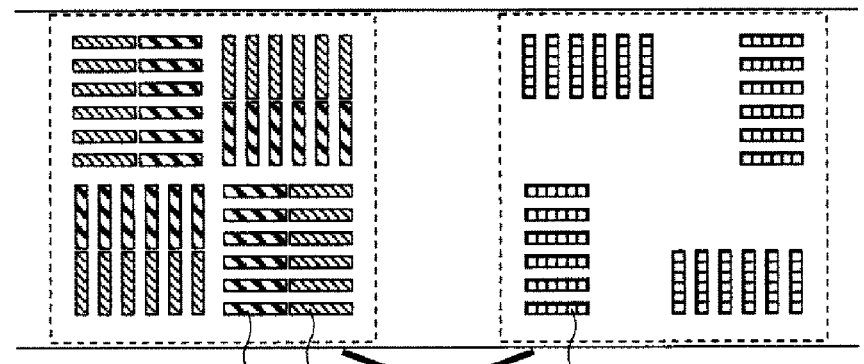

First, as shown in FIG. 24A, at the step as a target before bonding, main-measures 62 to be first alignment marks and main-measures 60 to be second alignment marks are formed. Here, the main-measures 62 to be the first alignment marks are in an unreversed pattern, and the main-measures 60 to be the second alignment marks are in a pattern that has been reversed in advance.

Then, as shown in FIG. 24B, at the step as a target before bonding, sub-measures 63 are formed for the main-measures 62 to be the first alignment marks.

From the pattern including the main-measures 62 and the sub-measures 63, overlay accuracy between steps before bonding is measured. In this manner, the overlay accuracy measurement pattern between steps before bonding may be formed using unreversed patterns.

Figure 24C:
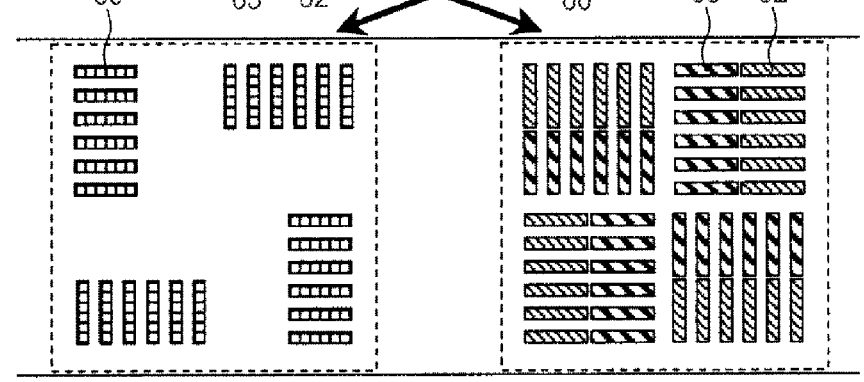

Here, the pattern shown in FIG. 24B is reversed by bonding of the substrates, and a pattern shown in FIG. 24C is obtained. The main-measures 60 to be the second alignment marks are reversed.

Figure 24D:
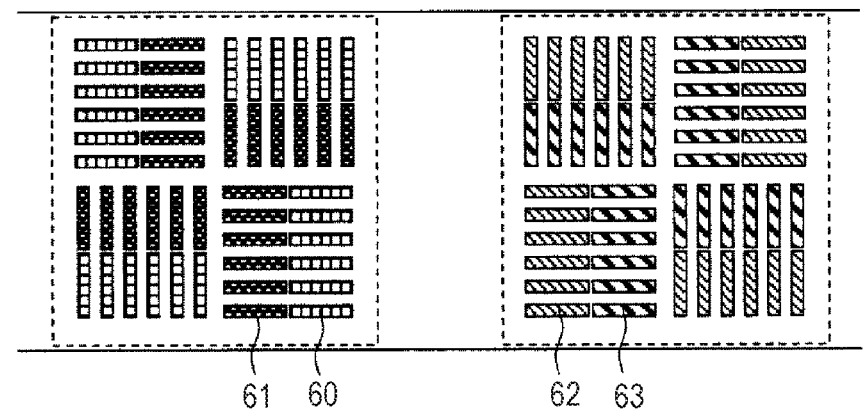

The main-measures 60 that have been reversed in advance are turned into a reversed pattern by bonding of the substrates, if the unreversed sub-measures 61 are overlaid thereon, a pattern shown in FIG. 24D is obtained. In this case, the measurement can be made with high accuracy but with no problem.

The overlay accuracy between the step before bonding and the step after bonding is measured from the main-measures 60 of the pattern obtained by reversal of the main-measures 60 that have been reversed in advance by bonding of the substrates and the unreversed sub-measures 61.

In the manufacturing method of the semiconductor device of the embodiment, in the case where the pattern is exposed to light on the second surface according to the circuit pattern of the first surface, the detection light of the alignment marks from the second surface can be detected with high accuracy even when the semiconductor substrate of silicon is thicker than 800 nm.

The embodiment can be applied to the first to fourth embodiments.

Seventh Embodiment

A pattern text indicating a step used for IPQC is also reversed by bonding of substrates like the alignment marks in the respective embodiments. The pattern text here refers to a pattern text including single or plural patterns and having certain meaning used for character recognition or pattern recognition.

Figures 25A, 25B, 26:
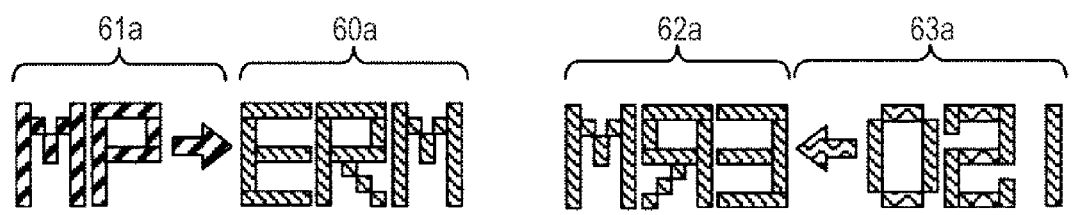
FIGS. 25A and 25B are pattern texts used for IPQC.
FIG. 26 shows pattern texts used for IPQC according to a seventh embodiment of the invention.

For example, if a pattern text of "P1L" shown in FIG. 25A is reversed by bonding of substrates, a text as shown in FIG. 25B is obtained.

The text is visually recognized properly before bonding, however, it becomes difficult to be visually recognized after bonding.

In the embodiment, for example, the name of the step of forming alignment marks in the first embodiment as a target step is referred to as an ERM (abbreviation of Etching Reversal Mark) step. Here, the step is shown by "ERM" on the semiconductor substrate.

Here, the ERM step is a target step of the element isolation step "ISO" of the process before bonding and a pad electrode formation step "MP" of the process after bonding.

Here, as indications indicating the overlay of the overlay measurement marks, pattern texts of "ISO→ERM" and "MP→ERM" are formed.

FIG. 26 shows pattern texts indicating "ISO→ERM" and "MP→ERM". Here, "ISO→ERM" is reversed.

Next, a method of forming the pattern texts indicating "ISO→ERM" and "MP→ERM" will be explained with reference to FIGS. 27A to 27D.

Figure 27A:
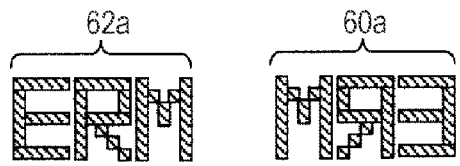
FIGS. 27A to 27D are pattern texts used for IPQC according to the seventh embodiment of the invention.

First, as shown in FIG. 27A, the pattern texts used in the process before bonding at the ERM step are provided in the normal state and the reversed state. In this regard, a pattern text 62a in the normal state of "ERM" is used at the step of ISO before bonding, and a reversed pattern text 60a is used at the MP step after bonding. Further, the placement locations of the pattern text in the process after bonding are replaced.

Figure 27B:
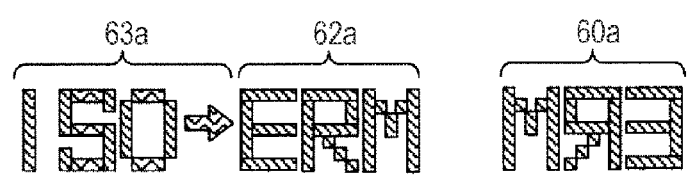

Then, as shown in FIG. 27B, a pattern text 63a at the ISO step is placed at the left position of the pattern text 62a in the normal state of ERM, and arrow patterns indicating combinations of steps are also placed.

Thereby, overlay of the ISO step on the ERM step may be normally observed.

Figure 27C:
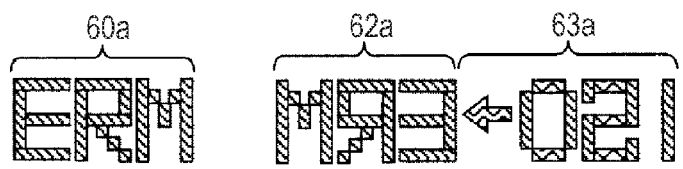

Then, the placement of the pattern texts is reversed by the processing in the bonding process, and the condition shown in FIG. 27C is obtained. Thereby, the reversed pattern text 60a of "ERM" may be reversed into the normal state after the bonding process, and the position thereof may be normally obtained.

Here, the group of pattern texts of "ISO→ERM" that have been normally observed are reversed and observed, and character recognition becomes very difficult. However, that is not problematic because the group of pattern texts of "ISO→ERM" are not used after bonding.

Figure 27D:
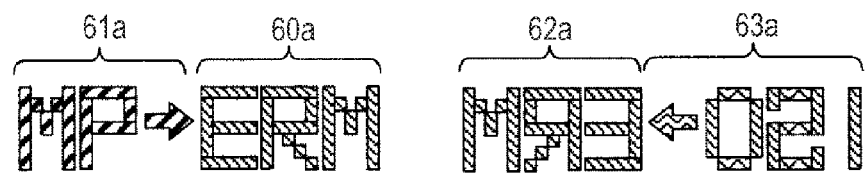

Then, as shown in FIG. 27D, at the MP step, the pattern text 61a is placed in the left position of the "ERM", and arrow patterns indicating combinations of steps are also placed. As described above, by the pattern text arrangement, the steps can be executed without changes from the operation of the manufacturing lines in the past.

Figure 28:
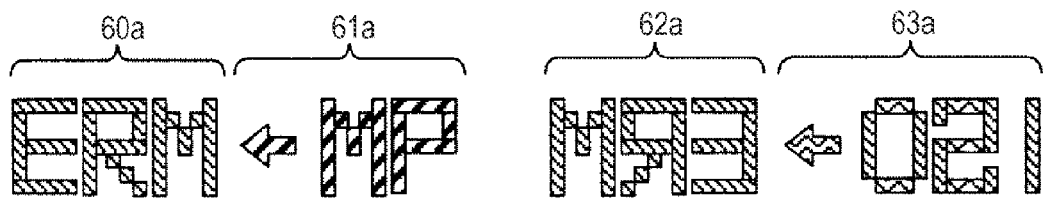
FIG. 28 shows pattern texts used for IPQC according to the seventh embodiment of the invention.
Figure 29A:
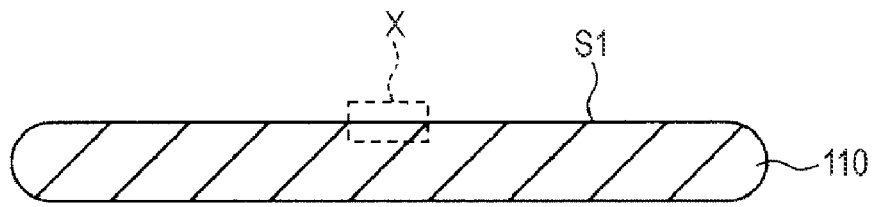
FIGS. 29A to 29D are schematic views showing a manufacturing method of a semiconductor device using a bonding technology of substrates according to a related art.
Figure 29B:
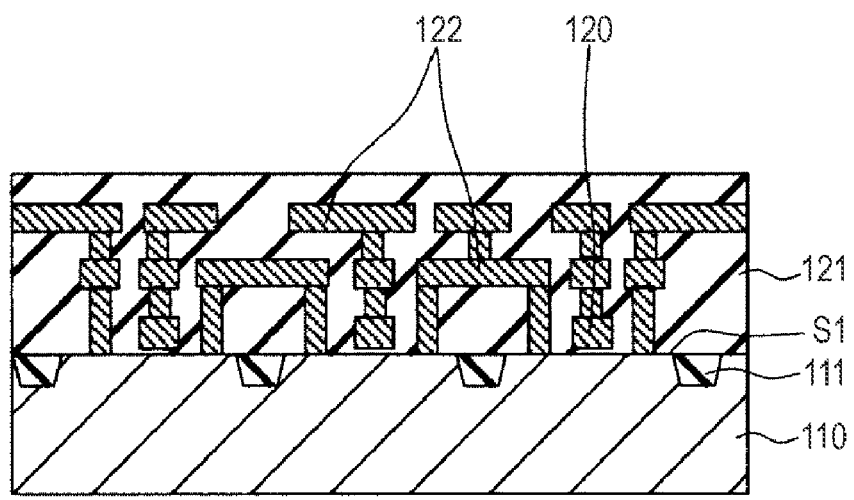
Figure 29C:
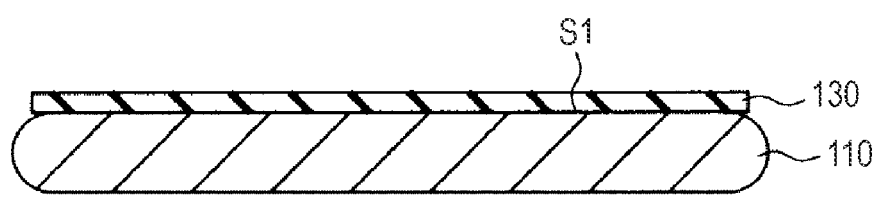
Figure 29D:
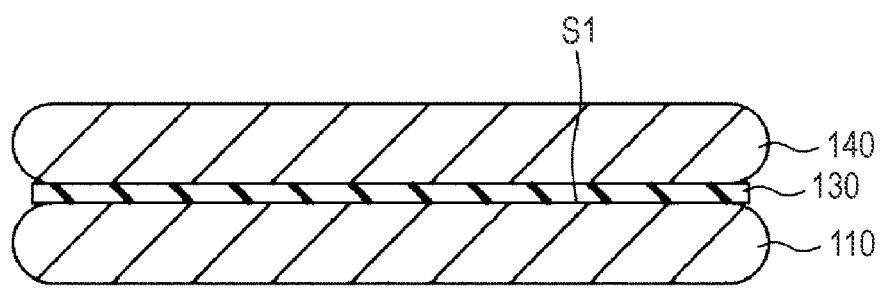
Figure 30A:
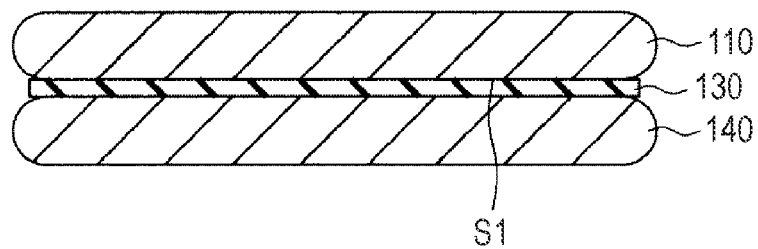
FIGS. 30A to 30D are schematic views showing the manufacturing method of the semiconductor device using the bonding technology of substrates according to the related art.
Figure 30B:
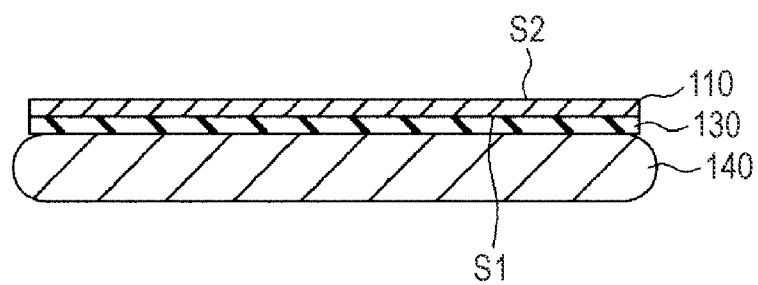
Figure 30C:
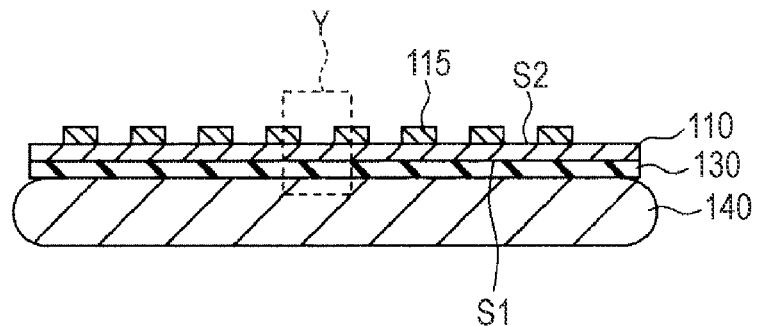
Figure 30D:
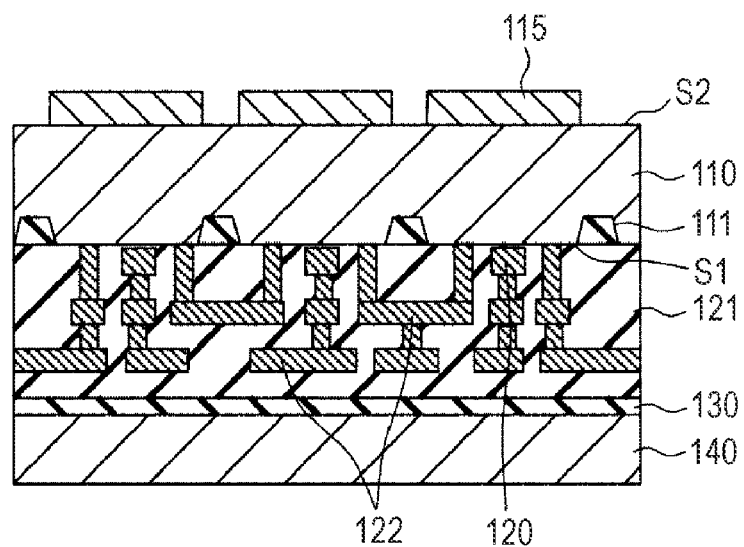
Figure 31A:
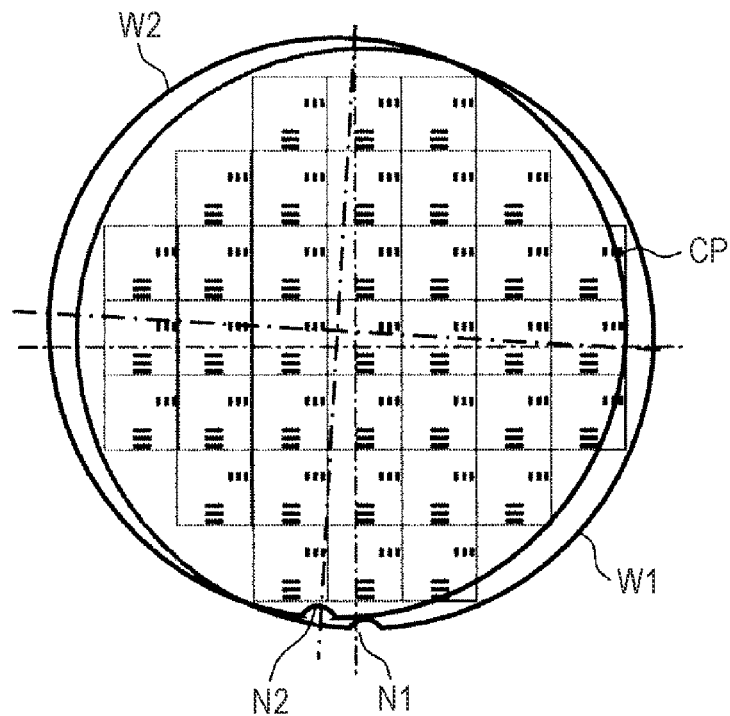
FIGS. 31A and 31B are a plan view and a perspective view showing a substrate bonding process according to the related art.
Figure 31B:
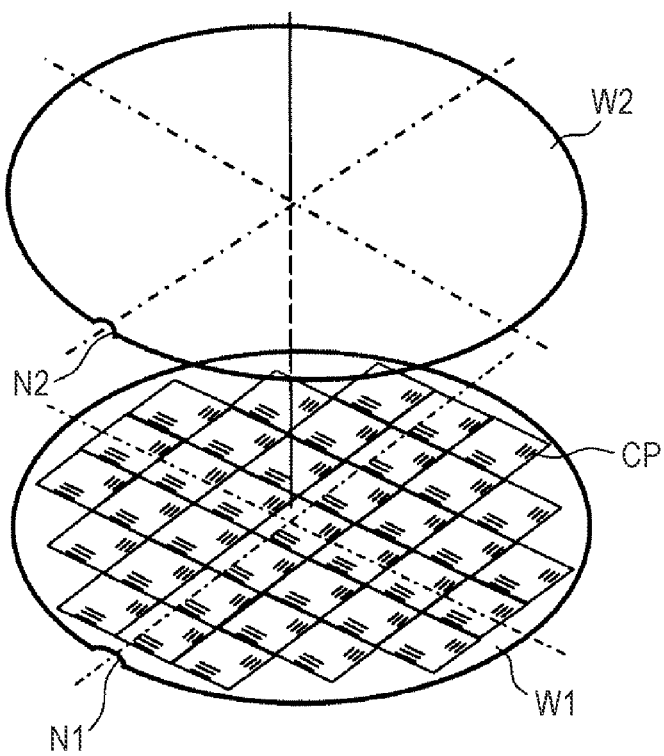
Figure 32A:
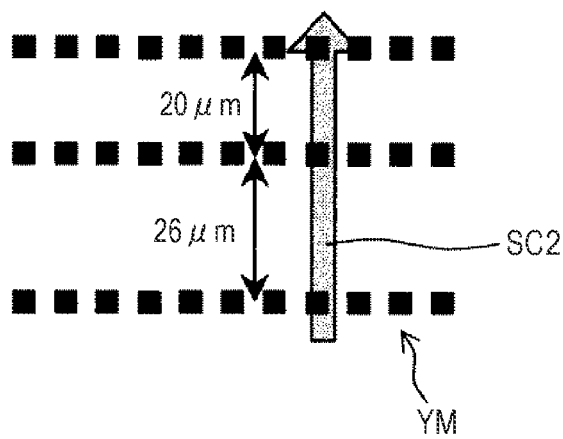
FIGS. 32A to 32D show schematic views of an example of alignment marks used in exposure equipment.
Figure 32B:
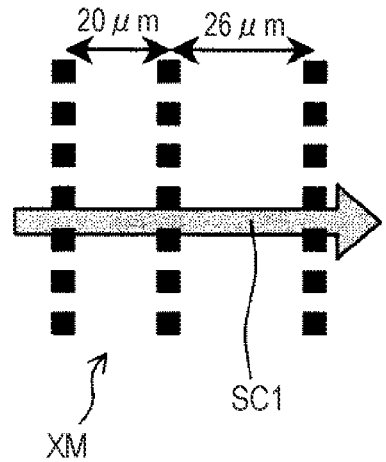
Figure 32C:
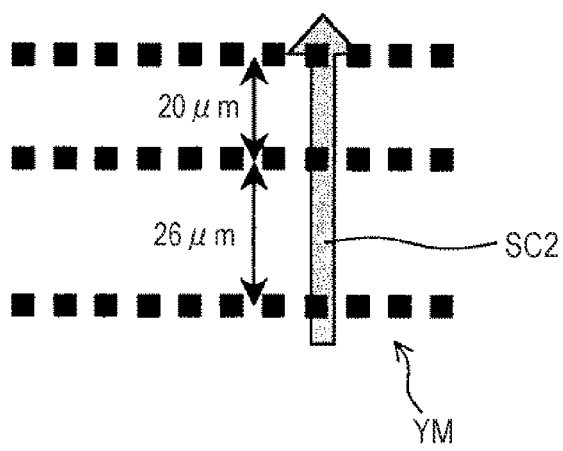
Figure 32D:
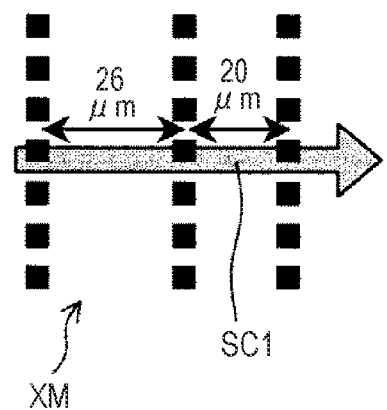

FIG. 28 shows pattern texts indicating "ISO→ERM" and "MP→ERM" like FIG. 26. Here, the positions of "MP" and "ERM" are opposite to those in FIG. 26. Except that, FIG. 28 is the same as FIG. 26.

In the manufacturing method of the semiconductor device of the embodiment, in the case where the pattern is exposed to light on the second surface according to the circuit pattern of the first surface, the detection light of the alignment marks can be detected with high accuracy even when the semiconductor substrate of silicon is thicker than 800 nm.

Here, even when the alignment mark contains the pattern text of IPQC, using the pattern text that has been reversed in advance for bonding of substrates, visibly recognizable texts can be formed.

The embodiment can be applied to the first to fourth embodiments.

According to the manufacturing method of the semiconductor device according to the embodiment, the following advantages may be enjoyed.

(1) Using the above described examples, processing can be performed on the first surface and the second surface of the semiconductor layer thicker than 800 nm and high-accuracy overlay measurement marks can be used. Therefore, the overlay accuracy can be improved and high-density and high-performance semiconductor devices can be manufactured.

(2) Further, unwanted increases of the region occupied by marks (patterns) on the scribe lines can be reduced, and the marks (patterns) can be arranged with the scribe line width in the past, and reduction of the theoretical yield can be prevented.

Furthermore, the rough alignment error can be prevented, and the operation availability of the manufacturing of the semiconductor devices in the past of the exposure equipment can be maintained and reduction of productivity can be prevented. Thereby, the bonded substrates can be manufactured at the cost in the past.

(3) Moreover, in the semiconductor manufacturing lines, the devices can be produced with the inspection and IPQC operation in the past, and reduction of the working efficiency can be prevented.

The invention is not limited to the above explanation.

For example, the embodiments may be applied to either of a CMOS sensor or CCD device.

Various changes may be made without departing from the scope of the invention.

The present application contains subject matter related to that disclosed in Japanese Priority Patent Application JP 2009-037233 filed in the Japan Patent Office on Feb. 19, 2009, the entire contents of which is hereby incorporated by reference.

What is claimed is:

1. A manufacturing method of a semiconductor device comprising the steps of:
  forming a first alignment mark and a second alignment mark by (i) forming one or more first grooves and one or more second grooves, respectively, on a first surface of a semiconductor substrate and (ii) filling the one or more first and second grooves with a material different from the semiconductor substrate;
  forming a first element on the first surface of the semiconductor substrate using the first alignment mark for alignment;
  bonding a support substrate to the first surface of the semiconductor substrate;
  reversing a bonded structure of the support substrate and the semiconductor substrate around a predetermined axis and thinning the semiconductor substrate from the side of a second surface of the semiconductor substrate at least until a thickness at which a position of the second alignment mark is detected by reflected light obtained by applying alignment light from the second surface side of the semiconductor substrate; and
  forming a second element on the second surface of the semiconductor substrate using the second alignment mark for alignment,
  wherein,
    in the step of forming the first alignment mark and the second alignment mark, (a) a first pattern, a second pattern, and a third pattern are formed, the second pattern being disposed between the first pattern and the third pattern, and (b) a first center mark is formed between the first pattern and the second pattern, and a second center mark different from the first center mark is formed between the second pattern and the third pattern,
    the first pattern and the second pattern correspond to the first alignment mark used for alignment on the first surface of the semiconductor substrate, and the second pattern and the third pattern correspond to the second alignment mark used for alignment on the second surface of the semiconductor substrate.

2. The method of claim 1, wherein the first, second, and third patterns and the first and second center marks are formed in a scribe line region.

3. The method of claim 1, wherein the first pattern and the second pattern are different from each other.

4. The method of claim 1, wherein the first pattern and the third pattern are the same.

5. The method of claim 1, wherein:
the first pattern comprises a first mark block,
the second pattern comprises a second mark block, and
the third pattern comprises a third mark block.

* * * * *